(12) United States Patent
Hsu

(10) Patent No.: US 12,438,081 B2
(45) Date of Patent: Oct. 7, 2025

(54) SEMICONDUCTOR STRUCTURE HAVING DIELECTRIC LINER AND METHOD OF MANUFACTURING THE SAME

(71) Applicant: NANYA TECHNOLOGY CORPORATION, New Taipei (TW)

(72) Inventor: Feng-Wen Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 386 days.

(21) Appl. No.: 18/131,462

(22) Filed: Apr. 6, 2023

(65) Prior Publication Data
US 2024/0339398 A1    Oct. 10, 2024

(51) Int. Cl.
*H01L 23/528* (2006.01)

(52) U.S. Cl.
CPC .................. *H01L 23/528* (2013.01)

(58) Field of Classification Search
CPC ............... H01L 23/528; H01L 21/7682; H01L 23/5283; H01L 21/76829; H01L 21/76837; H01L 21/76838; H01L 23/5329
See application file for complete search history.

(56) References Cited

U.S. PATENT DOCUMENTS

2017/0236835 A1* 8/2017 Nakamura .......... H01L 23/3171
                                                257/314
2021/0125998 A1* 4/2021 Kim ....................... H10B 12/05

OTHER PUBLICATIONS

Office Action and and the search report mailed on Mar. 1, 2024 related to Taiwanese Application No. 112122666.

* cited by examiner

Primary Examiner — Patricia D Valenzuela
(74) Attorney, Agent, or Firm — Xuan Zhang

(57) ABSTRACT

The present application provides a semiconductor structure having dielectric liner and a manufacturing method of the semiconductor structure. The semiconductor structure includes a substrate; a first bit line structure, disposed over the substrate, comprising a first conductive layer, a second conductive layer disposed over the first conductive layer, and a first dielectric layer disposed over the second conductive layer; a second bit line structure, disposed over the substrate, comprising a second dielectric layer, a third conductive layer disposed over the second dielectric layer, and a third dielectric layer disposed over the third conductive layer; a polysilicon layer, disposed over the substrate and surrounded by the first bit line structure and the second bit line structure; a dielectric liner, surrounding at least a portion of the polysilicon layer; and a landing pad, disposed over the polysilicon layer, the dielectric liner and the second bit line structure.

20 Claims, 26 Drawing Sheets

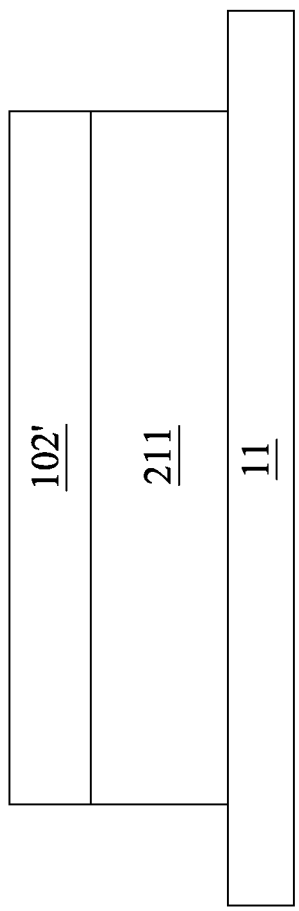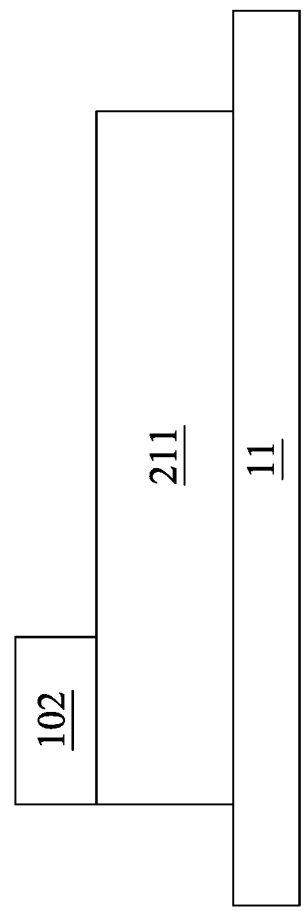

SEMICONDUCTOR STRUCTURE HAVING DIELECTRIC LINER AND METHOD OF MANUFACTURING THE SAME

TECHNICAL FIELD

The present disclosure relates to a semiconductor structure and a method of manufacturing the semiconductor structure. Particularly, the present disclosure relates to a semiconductor structure having a dielectric liner and a method for forming the semiconductor structure.

DISCUSSION OF THE BACKGROUND

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements on the substrate. As the semiconductor industry has progressed into advanced technology process nodes in pursuit of greater device density, higher performance, and lower costs, challenges of precise control of lithography across a wafer have arisen, and a product performance and a product yield can be also affected.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate; a first bit line structure, disposed over the substrate, comprising a first conductive layer, a second conductive layer disposed over the first conductive layer, and a first dielectric layer disposed over the second conductive layer; a second bit line structure, disposed over the substrate, comprising a second dielectric layer, a third conductive layer disposed over the second dielectric layer, and a third dielectric layer disposed over the third conductive layer; a polysilicon layer, disposed over the substrate and surrounded by the first bit line structure and the second bit line structure; a dielectric liner, surrounding at least a portion of the polysilicon layer; and a landing pad, disposed over the polysilicon layer, the dielectric liner and the second bit line structure.

Another aspect of the present disclosure provides a semiconductor structure. The semiconductor structure includes: a substrate; a first bit line structure, disposed over the substrate; a second bit line structure, disposed over the substrate; a polysilicon layer, surrounded by the first bit line structure and the second bit line structure; and a dielectric liner, disposed along a sidewall of the polysilicon layer.

Another aspect of the present disclosure provides a method of manufacturing a semiconductor structure. The method includes: providing a substrate; disposing a first conductive layer over the substrate; removing portions of the first conductive layer; disposing a second dielectric layer adjacent to the first conductive layer; disposing a second conductive layer over the first conductive layer and the second dielectric layer, and a first dielectric layer over the second conductive layer; removing portions of the first dielectric layer, the second conductive layer and the second dielectric layer, to form a first bit line structure comprising the first conductive layer, the second conductive layer and the first dielectric layer, to form a second bit line structure comprising the second dielectric layer, a third conductive layer and a third dielectric layer, and to form a recess between the first bit line structure and the second bit line structure; forming a first spacer surrounding the first bit line structure and a second spacer surrounding the second bit line structure; forming a first polysilicon layer within the recess and over the substrate; forming a dielectric liner along a sidewall of the first spacer, a sidewall of the second spacer and over the polysilicon layer; forming a second polysilicon layer over the first polysilicon layer; and removing portions of the dielectric liner.

In conclusion, the application discloses a manufacturing method of a semiconductor structure and a semiconductor structure thereof. A presence of a dielectric liner of the semiconductor structure prevents a storage leakage from the bit line structure to the polysilicon layer, and the correctness of the data stored in the bit line structure can be protected.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 3 to 29 are schematic cross-sectional diagrams of intermediate stages in the formation of a semiconductor structure in accordance with some embodiments of the present disclosure.

DETAILED DESCRIPTION

Figure 1:
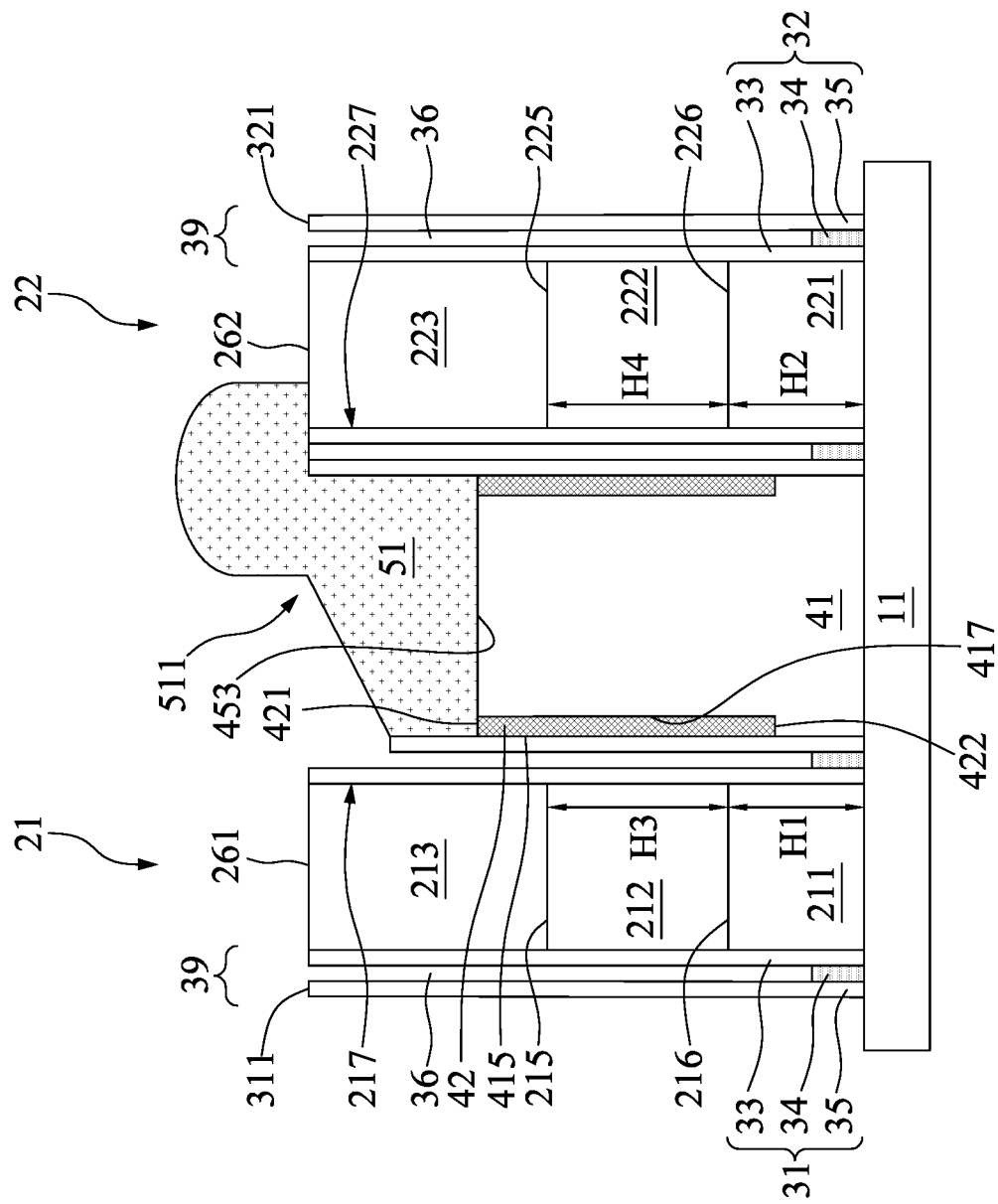
FIG. 1 is schematic cross-sectional diagram of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As the semiconductor industry has progressed into advanced technology process nodes in pursuit of greater device density, it has reached an advanced precision of photolithography. In order to further reduce device sizes, dimensions of elements and distances between different elements have to be proportionally reduced. However, with the reductions in the dimensions of the elements and the distances between different elements, challenges of precise control on the dimensions and the distances have arisen. For instance, a landing pad can be disconnected by a sharp corner of a bit line structure after an etching operation.

FIG. 1 is schematic cross-sectional diagram of a semiconductor structure in accordance with some embodiments of the present disclosure. The semiconductor structure may include a substrate 11, a first bit line structure 21 disposed over the substrate 11, a second bit line structure 22 disposed over the substrate 11, a polysilicon layer 41 disposed over the substrate 11 and surrounded by the first bit line structure 21 and the second bit line structure 22, a dielectric liner 42, surrounding at least a portion 417 of the polysilicon layer 41; and a landing pad 51 disposed over the polysilicon layer 41, the dielectric liner 42 and the second bit line structure 22.

In some embodiments, the substrate 11 may have a multilayer structure, or the substrate 11 may include a multilayer compound semiconductor structure. In some embodiments, the substrate 11 includes semiconductor devices, electrical components, electrical elements or a combination thereof. In some embodiments, the substrate 11 includes transistors or functional units of transistors. In some embodiments, the substrate 11 includes active components, passive components, and/or conductive elements. The active components may include a memory die (e.g., a dynamic random-access memory (DRAM) die, a static random-access memory (SRAM) die, etc.), a power management die (e.g., a power management integrated circuit (PMIC) die), a logic die (e.g., system-on-a-chip (SoC), central processing unit (CPU), graphics processing unit (GPU), application processor (AP), microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. The passive components may include a capacitor, a resistor, an inductor, a fuse or other passive components. The conductive elements may include metal lines, metal islands, conductive vias, contacts or other conductive elements.

The active components, passive components, and/or conductive elements as mentioned above can be formed in and/or over a semiconductor substrate. The semiconductor substrate may be a bulk semiconductor, a semiconductor-on-insulator (SOI) substrate, or the like. The semiconductor substrate can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

The first bit line structure 21 includes a first conductive layer 211, a second conductive layer 212 disposed over the first conductive layer 211 and a first dielectric layer 213 disposed over the second conductive layer 212. In some embodiments, a height of the first dielectric layer 213 is greater than a height of the second conductive layer 212. In some embodiments, a height of the second conductive layer 212 is greater than a height of the first conductive layer 211. In some embodiments, the first conductive layer 211 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), or other suitable materials. In some embodiments, the first conductive layer 211 includes tungsten (W). In some embodiments, the second conductive layer 212 includes a material different from a material of the first conductive layer 211. In some embodiments, the first dielectric layer 213 includes silicon nitride, metallic nitride, or a combination thereof.

The second bit line structure 22 includes a second dielectric layer 221, a third conductive layer 222 disposed over the second dielectric layer 221, and a third dielectric layer 223 disposed over the third conductive layer 222. In some embodiments, a thickness of the third dielectric layer 223 is greater than a thickness of the third conductive layer 222. In some embodiments, a thickness of the third conductive layer 222 is greater than a thickness of the second dielectric layer 221. In some embodiments, the second dielectric layer 221 includes silicon nitride, metallic nitride, or a combination thereof. In some embodiments, the third dielectric layer 223 includes a nitride material same as a nitride material of the second dielectric layer 221. In some embodiments, the third conductive layer 222 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), or other suitable materials. In some embodiments, the third conductive layer 222 includes tungsten (W).

In some embodiments, the first dielectric layer 213, the second dielectric layer 221 and the third dielectric layer 223 include a same material. In some embodiments, the second conductive layer 212 and the third conductive layer 222 include a same material.

In some embodiments, a height H1 of the first conductive layer 211 of the first bit line structure 21 is substantially equal to a height H2 of the second dielectric layer 221 of the second bit line structure 22. In some embodiments, a height H3 of the second conductive layer 212 of the first bit line structure 21 is substantially equal to a height H4 of the third conductive layer 222 of the second bit line structure 22.

The semiconductor structure may further include a first spacer 31 surrounding the first bit line structure 21, and a second spacer 32 surrounding the second bit line structure 22. In some embodiments, detailed structures and configurations of the first spacer 31 and the second spacer 32 are substantially identical. For a purpose of brevity, only the first spacer 31 is described in the following description, and detailed description of the second spacer 32 is omitted herein. However, such omission is not intended to limit the present disclosure.

In some embodiments, the first spacer 31 may be a multi-layer 39 structure. In some embodiments, the first spacer 31 includes a first nitride layer 33, an oxide layer 34 and a second nitride layer 35. In some embodiments, the oxide layer 34 is sandwiched between the first nitride layer 33 and the second nitride layer 35. In some embodiments, a thickness of the first nitride layer 33 is substantially equal to a thickness of the second nitride layer 35. In some embodiments, a thickness of the oxide layer 34 is less than that of the first nitride layer 33 or the second nitride layer 35. In some embodiments, the first nitride layer 33 and the second nitride layer 35 include a same nitride material. In some embodiments, the oxide layer 34 includes silicon oxide. In some embodiments, the first nitride layer 33 or the second nitride layer 35 includes silicon nitride.

In some embodiments, the first spacer 31 is disposed along a sidewall 217 of the first bit line structure 21. In some embodiments, the second spacer 32 is disposed a sidewall 227 of the second bit line structure 22. In some embodiments, the first spacer 31 and the second spacer 32 surround the polysilicon layer 41 and the dielectric liner 42.

The polysilicon layer 41 is disposed over the substrate 11 and surrounded by the first bit line structure 21 and the second bit line structure 22. In some embodiments, the polysilicon layer is disposed between the first bit line structure 21 and the second bit line structure 22 adjacent to the first bit line structure 21. In some embodiments, the polysilicon layer 41 is surrounded by the first bit line structure 21 and the second bit line structure 22. In some embodiments, a top surface 453 of the polysilicon layer 41 is above the second conductive layer 212 and is above the third conductive layer 222. In some embodiments, the top surface 453 of the polysilicon layer 41 is below a top surface 261 of the first bit line structure 21 and is below a top surface 262 of the second bit line structure 22. The polysilicon layer 41 can function as a contact for forming electrical connections to other electrical components, devices or elements in the substrate 11. In some embodiments, the polysilicon layer 41 may include multiple portions (i.e., the polysilicon layer 41 between the first bit line structure 21 and the second bit line structure 22 can be one of the multiple portions) electrically isolated from one another, and different portions of the polysilicon layer 41 may electrically connect to different electrical components, devices or elements in the substrate 11.

In some embodiments, the first spacer 31 and the second spacer 32 protrude from the top surface 453 of the polysilicon layer 41. In some embodiments, a top surface 311 of the first spacer 31 and a top surface 321 of the second spacer 32 are above the top surface 453 of the polysilicon layer.

The dielectric liner 42 surrounds at least a portion 417 of the polysilicon layer 41. In some embodiments, the dielectric liner 42 is disposed along a sidewall 415 of the polysilicon layer 41. In some embodiments, a thickness of the dielectric liner 42 is substantially less than half of a width of the polysilicon layer 41.

In some embodiments, a top surface 421 of the dielectric liner 42 is above a top surface 215 of the second conductive layer 212, and a bottom surface 422 of the dielectric liner 42 is below a bottom surface 216 of the second conductive layer 212. In other words, a height of the dielectric liner 42 is substantially greater than a height of the second conductive layer 212 of the first bit line structure 21.

In some embodiments, the top surface 421 of the dielectric liner 42 is above a top surface 225 of the third conductive layer 222, and the bottom surface 422 of the dielectric liner 42 is below a bottom surface 226 of the third conductive layer 222. In other words, a height of the dielectric liner 42 is substantially greater than a height of the third conductive layer 222 of the second bit line structure 22.

One or more landing pads 51 may be disposed over the polysilicon layer 41, the dielectric liner 42 and the second bit line structure 22. In some embodiments, the landing pad 51 includes one or more metallic materials, such as aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, each of the landing pads 51 is disposed over a corresponding portion of the polysilicon layer 41. In some embodiments, the landing pads 51 are electrically isolated from one another.

In some embodiments, the landing pad 51 includes a neck portion 511 aligned with the top surface 262 of the second bit line structure 22. In some embodiments, the neck portion 511 is a portion of the landing pad 51 with the narrowest width. In some embodiments, the top surface 421 of the dielectric liner 42 is below the neck portion 511 of the landing pad 45.

Figure 2:
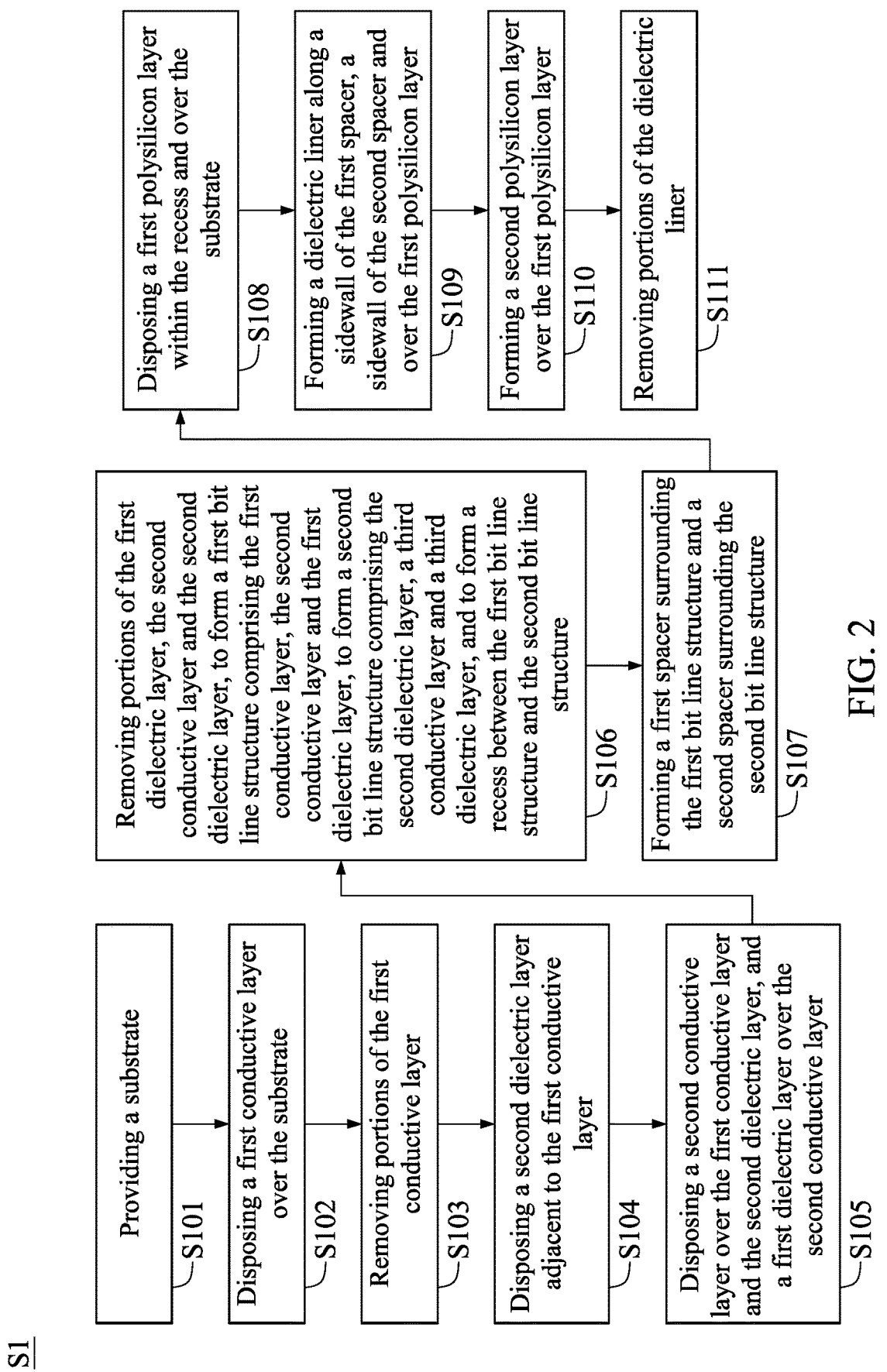
FIG. 2 is a flow diagram illustrating a method for manufacturing a semiconductor device in accordance with some embodiments of the present disclosure.

FIG. 2 is a flow diagram illustrating a method S1 for manufacturing a semiconductor device in accordance with some embodiments of the present disclosure. The method S1 includes a number of operations (S101, S102, S103, S104, S105, S106, S107, S108, S109, S110 and S111) and the description and illustration are not deemed as a limitation to the sequence of the operations. In the operation S101, a substrate is provided. In the operation S102, a first conductive layer is disposed over the substrate. In the operation S103, portions of the first conductive layer are removed. In the operation S104, a second dielectric layer is disposed adjacent to the first conductive layer. In the operation S105, a second conductive layer is disposed over the first conductive layer and the second dielectric layer, and a first dielectric layer is disposed over the second conductive layer. In the operation S106, portions of the first dielectric layer, the second conductive layer and the second dielectric layer are removed, to form a first bit line structure comprising the first conductive layer, the second conductive layer and the first dielectric layer, to form a second bit line structure comprising the second dielectric layer, a third conductive layer and a third dielectric layer, and to form a recess between the first bit line structure and the second bit line structure. In the operation S107, a first spacer surrounding the first bit line structure and a second spacer surrounding the second bit line structure are formed. In the operation S108, a first polysilicon layer is formed within the recess and over the substrate. In the operation S109, a dielectric liner is formed along a sidewall of the first spacer, a sidewall of the second spacer and over the polysilicon layer. In the operation S110, a second polysilicon layer is formed over the first polysilicon layer. In the operation S111, portions of the dielectric liner are removed. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

FIGS. 3 to 29 are schematic cross-sectional diagrams illustrating various fabrication stages constructed according to the method S1 for manufacturing a semiconductor structure similar to that shown in FIG. 1 in accordance with some embodiments of the present disclosure. The stages shown in FIGS. 3 to 29 are also illustrated schematically in the process flow in FIG. 1. In the subsequent discussion, the fabrication stages shown in FIGS. 3 to 29 are discussed in reference to the process steps in FIG. 2.

Figure 3:
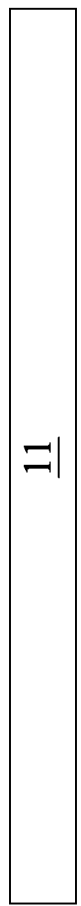

Referring to FIG. 3, FIG. 3 is a schematic cross-sectional diagram at a stage of the method S1 in accordance with some embodiments of the present disclosure. In the operation S101, a substrate 11 is provided, received, or formed. In some embodiments, the substrate 11 may have a multilayer structure, or the substrate 11 may include a multilayer compound semiconductor structure. In some embodiments, the substrate 11 includes semiconductor devices, electrical components, electrical elements or a combination thereof. In some embodiments, the substrate 11 includes transistors or functional units of transistors. In some embodiments, the substrate 11 includes active components, passive components, and/or conductive elements. In some embodiments, the substrate 11 is similar to that shown in FIG. 1. The substrate 11 can be formed following a conventional method for forming a semiconductor substrate.

Figure 4:
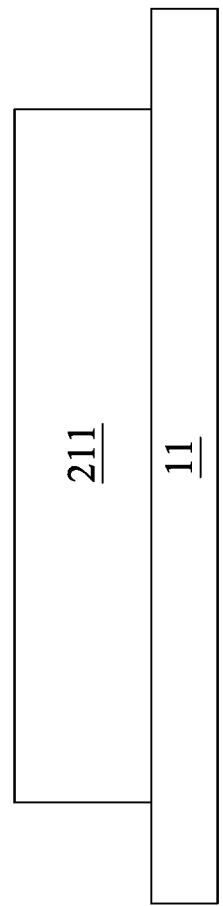

Referring to FIG. 4, FIG. 4 is a schematic cross-sectional diagram at a stage of the method S1 in accordance with some embodiments of the present disclosure. In some embodiments, the operation S102 is performed after the operation S101. After the operation S101, a first conductive layer 211 is disposed or formed over the substrate 11.

Referring to FIGS. 5 to 8, FIGS. 5 to 8 are schematic cross-sectional diagrams at a stage of the method S1 in accordance with some embodiments of the present disclosure. In some embodiments, the operation S103 is performed after the operation S102 and includes multiple steps.

Referring to FIGS. 5 to 6, FIGS. 5 to 6 are schematic cross-sectional diagrams at a stage of the method S1 in accordance with some embodiments of the present disclosure. A patterned mask 102 is disposed over the first conductive layer 211 according to step S102 in FIG. 2. In some embodiments, the disposing of the patterned mask 102 includes disposing a photoresist 102' over the first conductive layer 211 as shown in FIG. 5, and then removing some portions of the photoresist 102' to form the patterned mask 102 as shown in FIG. 6.

In some embodiments, the photoresist 102' is disposed by spin coating or any other suitable process. In some embodiments, some portions of the photoresist 102' are removed by etching or any other suitable process. In some embodiments, at least a portion of the first conductive layer 211 is exposed through the patterned mask 102 after the formation of the patterned mask 102 as shown in FIG. 6.

Figure 7:
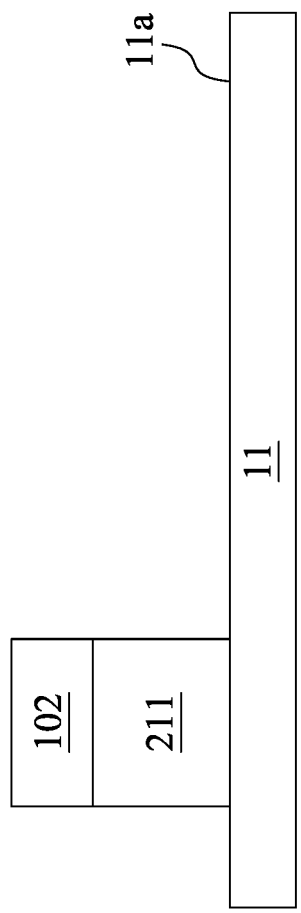
Figure 8:
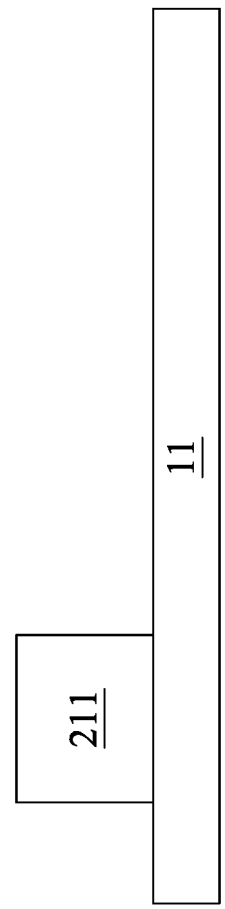

Referring to FIGS. 7 to 8, FIGS. 7 to 8 are schematic cross-sectional diagrams at a stage of the method S1 in accordance with some embodiments of the present disclosure. Portions of the first conductive layer 211 are removed. In some embodiments, the removal of the first conductive layer 211 includes etching or any other suitable process. In some embodiments, at least a portion of a surface 11a of the substrate 11 is exposed after the removal of portions of the first conductive layer 211 as shown in FIG. 7. In some embodiments as shown in FIG. 8, after the removal of portions of the first conductive layer 211, the patterned mask 102 is removed by etching, stripping or any other suitable process.

Figure 9:
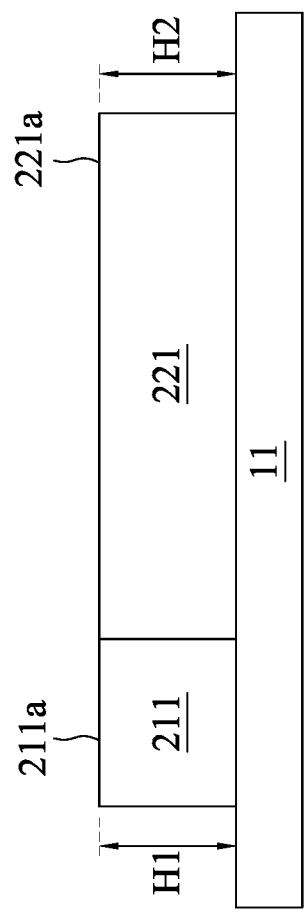

Referring to FIG. 9, FIG. 9 is a schematic cross-sectional diagram at a stage of the method S1 in accordance with some embodiments of the present disclosure. After the operation S104, a second dielectric layer 221 is disposed or formed over the substrate 11 and adjacent to the first conductive layer 211. In some embodiments, a top surface 211a of the first conductive layer 211 is substantially coplanar with a top surface 221a of the second dielectric layer 221. In some embodiments, a height H1 of the first conductive layer 211 is substantially equal to a height H2 of the second dielectric layer 221.

Figure 10:
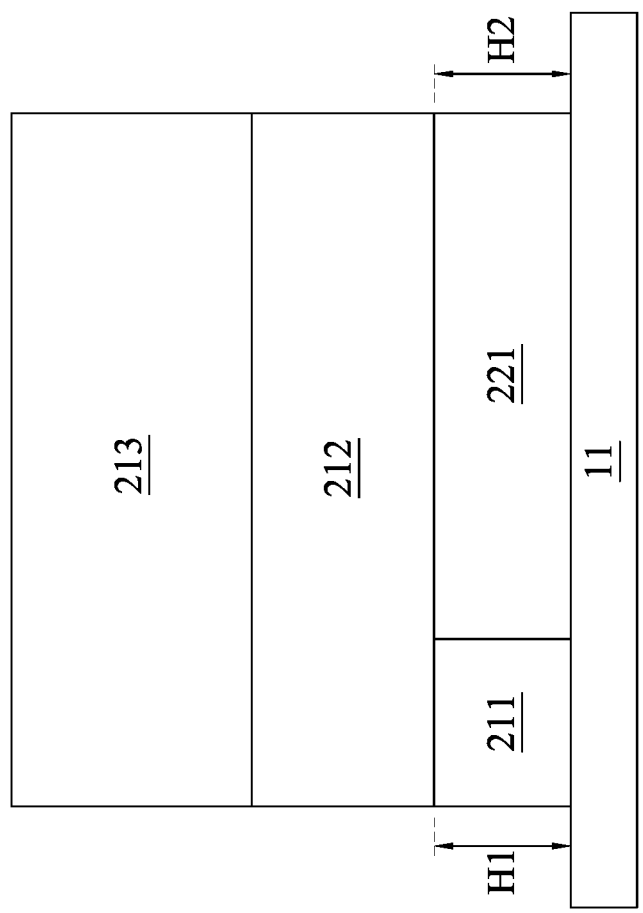

Referring to FIG. 10, FIG. 10 is a schematic cross-sectional diagram at a stage of the method S1 in accordance with some embodiments of the present disclosure. After the operation S105, a second conductive layer 212 is disposed over the first conductive layer 211 and the second dielectric layer 221, and a first dielectric layer 213 is disposed over the second conductive layer 212. In some embodiments, a thickness of the first dielectric layer 213 is greater than a thickness of the second conductive layer 212. In some embodiments, the thickness of the second conductive layer 212 is greater than a thickness of first conductive layer 211 and the second dielectric layer 221.

In some embodiments, each of the second dielectric layer 221 and the first dielectric layer 213 includes one or more dielectric materials. In some embodiments, the dielectric material includes a polymeric material, an organic material, an inorganic material, a photoresist material or a combination thereof. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure. In some embodiments, the dielectric material includes silicon oxide ($SiO_x$), silicon nitride ($Si_xN_y$), silicon oxynitride (SiON), metallic nitride or a combination thereof.

In some embodiments, the second dielectric layer 221 or the first dielectric layer 213 includes silicon nitride, metallic nitride, or a combination thereof. In some embodiments, the second dielectric layer 221 or the first dielectric layer 213 is formed by a blanket deposition. In some embodiments, the second dielectric layer 221 or the first dielectric layer 213 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof.

In some embodiments, the first conductive layer 211 or the second conductive layer 212 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), other applicable conductive materials, oxides of the above-mentioned metals, or a combination thereof. In some embodiments, the first conductive layer 211 or the second conductive layer 212 includes tungsten (W). In some embodiments, the second conductive layer 212 includes a material different from a material of the first conductive layer 211. In some embodiments, the first conductive layer 211 or the second conductive layer 212 is formed by CVD, PVD, a sputtering operation, an electroplating operation, an electroless-plating operation, or a combination thereof.

Referring to FIGS. 11 to 14, FIGS. 11 to 14 are schematic cross-sectional diagrams at a stage of the method S1 in accordance with some embodiments of the present disclosure. In some embodiments, the operation S106 is performed after the operation S105 and includes multiple steps.

Figure 11:
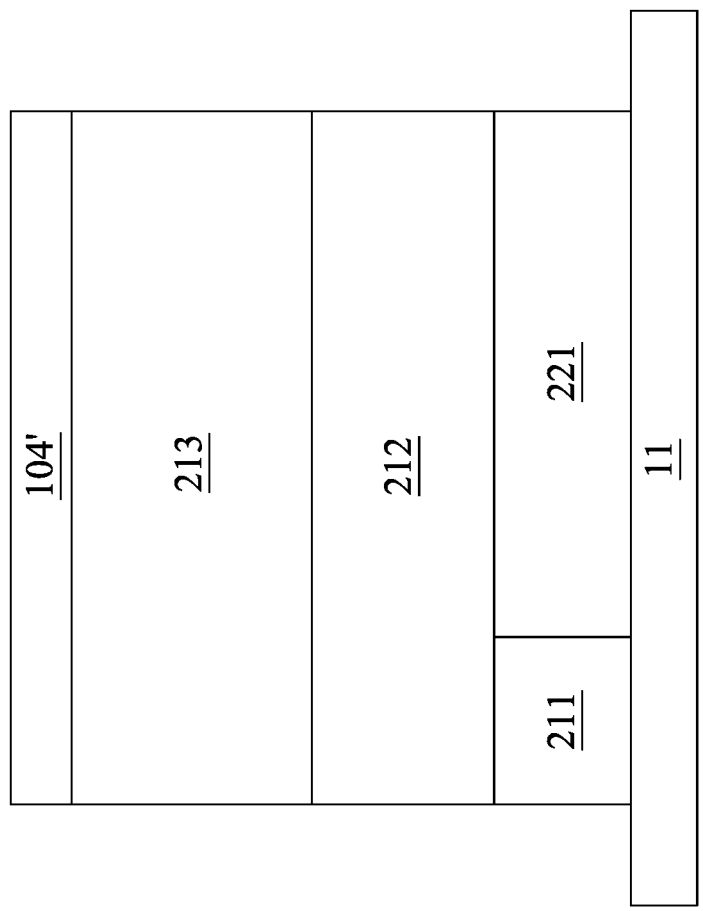
Figure 12:
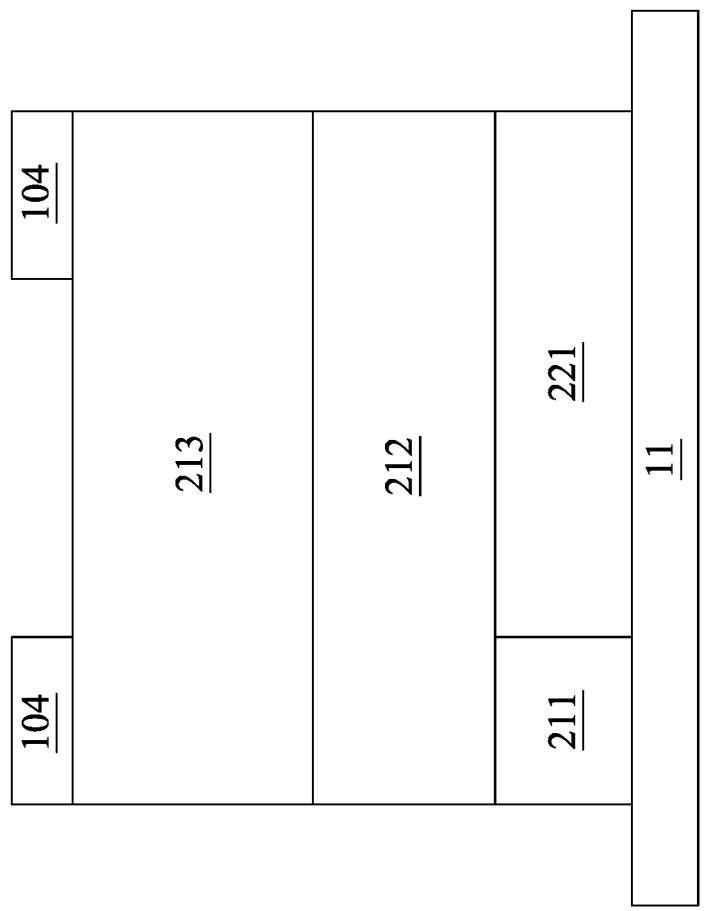

Referring to FIGS. 11 to 12, FIGS. 11 to 12 are schematic cross-sectional diagrams at a stage of the method S1 in accordance with some embodiments of the present disclosure. Patterned masks 104 is disposed over the first dielectric layer 213 according to step S105 in FIG. 10. In some embodiments, the disposing of the patterned mask 104 includes disposing photoresists 104' over the first dielectric layer 213 as shown in FIG. 11, and then removing some portions of the photoresists 104' to form the patterned masks 104 as shown in FIG. 12.

In some embodiments, the photoresists 104' are disposed by spin coating or any other suitable process. In some embodiments, some portions of the photoresists 104' are removed by etching or any other suitable process. In some embodiments, at least a portion of the first dielectric layer 213 is exposed through the patterned masks 104 after the formation of the patterned masks 104 as shown in FIG. 12.

Figure 13:
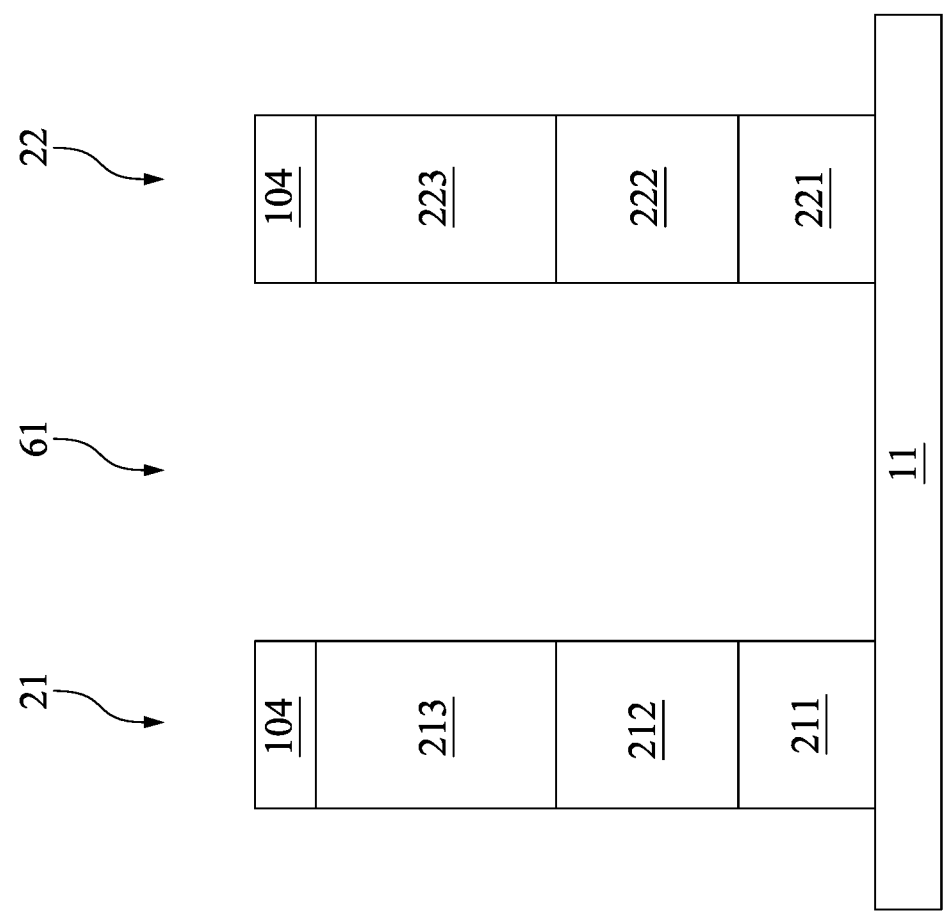
Figure 14:
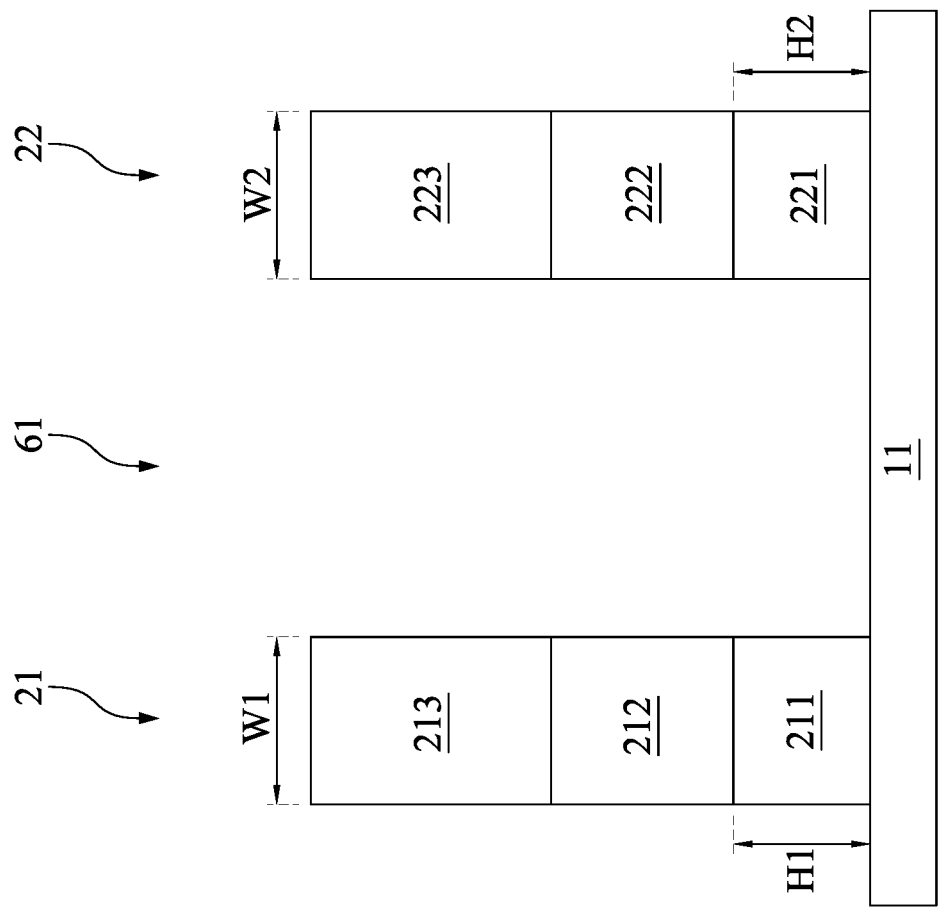

Referring to FIGS. 13 to 14, FIGS. 13 to 14 are schematic cross-sectional diagrams at a stage of the method S1 in accordance with some embodiments of the present disclosure. Portions of the first dielectric layer 213, the second conductive layer 212 and the second dielectric layer 221 are removed.

In some embodiments, the removal of the portions of the first dielectric layer 213, the second conductive layer 212 and the second dielectric layer 221 includes etching or any other suitable process.

In some embodiments, after the removal of portions of the first dielectric layer 213, the second conductive layer 212 and the second dielectric layer 221 as shown in FIG. 13, a first bit line structure 21, a second bit line structure 22 and a recess 61 between the first bit line structure 21 and the second bit line structure 22 are formed. The first bit line structure 21 includes the first conductive layer 211, the second conductive layer 212 and the first dielectric layer 213. The second bit line structure 22 includes the second dielectric layer 221, the third conductive layer 222 and the third dielectric layer 223. In some embodiments, a width W1 of the first bit line structure 21 is substantially equal to a width W2 of the second bit line structure 22.

In some embodiments as shown in FIG. 14, after the removal of portions of the first dielectric layer 213, the second conductive layer 212 and the second dielectric layer 221, the patterned masks 104 are removed by etching, stripping or any other suitable process.

Figure 15:
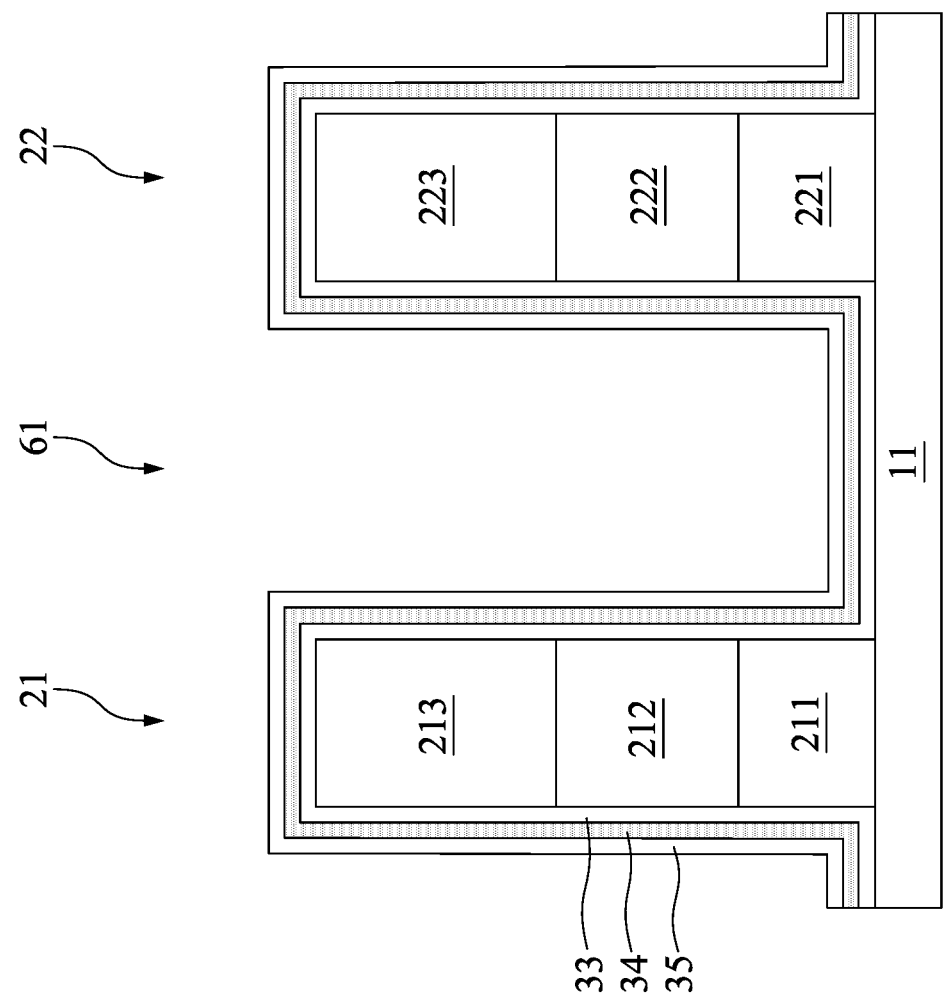
Figure 16:
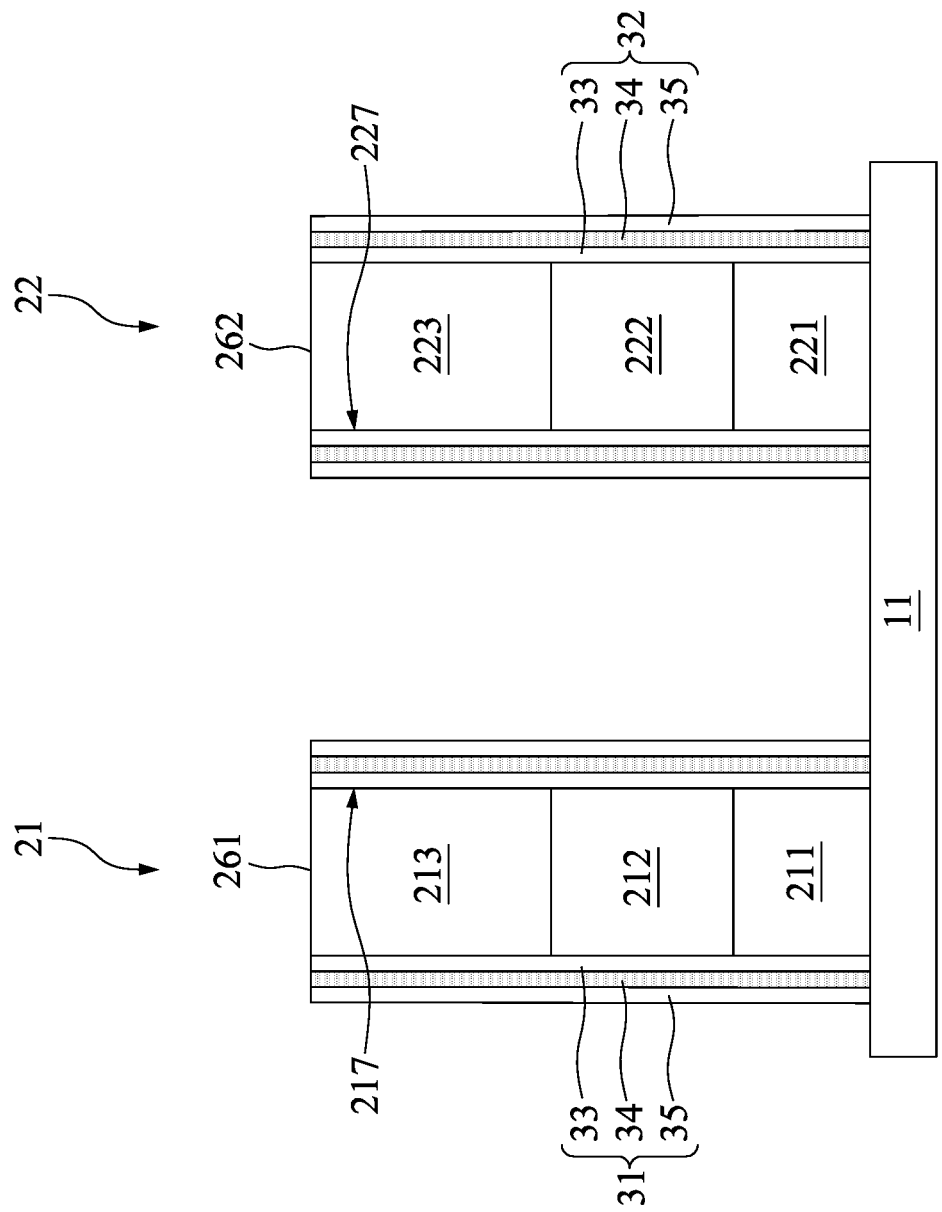

Referring to FIGS. 15 to 16, FIGS. 15 to 16 are schematic cross-sectional diagrams at a stage of the method S1 in accordance with some embodiments of the present disclosure. In some embodiments, the operation S107 is performed after the operation S106 and includes multiple steps.

Referring to FIG. 15, FIG. 15 is a schematic cross-sectional diagram at a stage of the method S1 in accordance with some embodiments of the present disclosure. After the formation of the first bit line structure 21 and the second bit line structure 22, one or more conformal layers are formed over the first bit line structure 21, the second bit line structure 22 and the substrate 11. In some embodiments, each of the conformal layers includes a dielectric material, and two adjacent conformal layers may include different dielectric materials. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the multiple conformal layers include a first nitride layer 33, a second nitride layer 35, and an oxide layer 34 between the first nitride layer 33 and the second nitride layer 35 as shown in FIG. 15. In some embodiments, a profile of each of the first nitride layer 33, the oxide layer 34 and the second nitride layer 35 is conformal to a profile of the first bit line structure 21, the second bit line structure 22 and the substrate 11. In some embodiments, the first nitride layer 33, the oxide layer 34 and the second nitride layer 35 are individually formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, each of the first nitride layer 33, the oxide layer 34 and the second nitride layer 35 is formed by a conformal deposition. In some embodiments, a thickness of the first nitride layer 33 is substantially equal to a thickness of the second nitride layer 35. In some embodiments, a thickness of the oxide layer 34 is less than that of the first nitride layer 33 or the second nitride layer 35. In some embodiments, the first nitride layer 33 and the second nitride layer 35 include a same nitride material. In some embodiments, the oxide layer 34 includes silicon oxide. In some embodiments, the first nitride layer 33 or the second nitride layer 35 includes silicon nitride.

Referring to FIG. 16, FIG. 16 is a schematic cross-sectional diagram at a stage of the method S1 in accordance with some embodiments of the present disclosure. After the formation of the conformal layers (e.g., the first nitride layer 33, the oxide layer 34 and the second nitride layer 35), horizontal portions of the conformal layers are removed to form a first spacer 31 surrounding the first bit line structure 21 and a second spacer 32 surrounding the second bit line structure 22. In some embodiments, the removal of the horizontal portions of the conformal layers includes a wet etching operation, a dry etching operation, or a combination thereof performed to form the first spacer 31 and the second spacer 32. In some embodiments, the removal of the horizontal portions of the conformal layers includes a selective wet etching, a directional dry etching, an ion beam etching, a reactive ion etching, or a combination thereof.

In some embodiments, the horizontal portions of the second nitride layer 35, the horizontal portions of the oxide layer 34, and the horizontal portions of the first nitride layer 33 are concurrently removed by one etching operation. In some embodiments, the horizontal portions of the second nitride layer 35, the horizontal portions of the oxide layer 34, and the horizontal portions of the first nitride layer 33 are individually removed by separate etching operations. The removal of the horizontal portions of the second nitride layer 35, the oxide layer 34 and the first nitride layer 33 by multiple etching operations can be similar to the multiple etching operations of the formation of the first bit line structure 21 and the second bit line structure 22, and repeated description is omitted herein. In some embodiments, the first spacer 31 surrounds sidewalls 217 of the first bit line structures 21, and the second spacer surrounds sidewalls 227 of the second bit line structures 22, as shown in FIG. 16. In some embodiments, a top surface 261 of the first bit line structure 21 and a top surface 262 of the second bit line structure are exposed through the first spacer 31 and the second spacer 32, respectively. In some embodiments, a height of the first spacer 31 is substantially equal to a height of the first bit line structures 21, and a height of the second spacer 32 is substantially equal to a height of the second bit line structures 22.

Referring to FIGS. 17 to 20, FIGS. 17 to 20 are schematic cross-sectional diagrams at a stage of the method S1 in accordance with some embodiments of the present disclosure. In some embodiments, the operation S108 is performed after the operation S107 and includes multiple steps.

Figure 17:
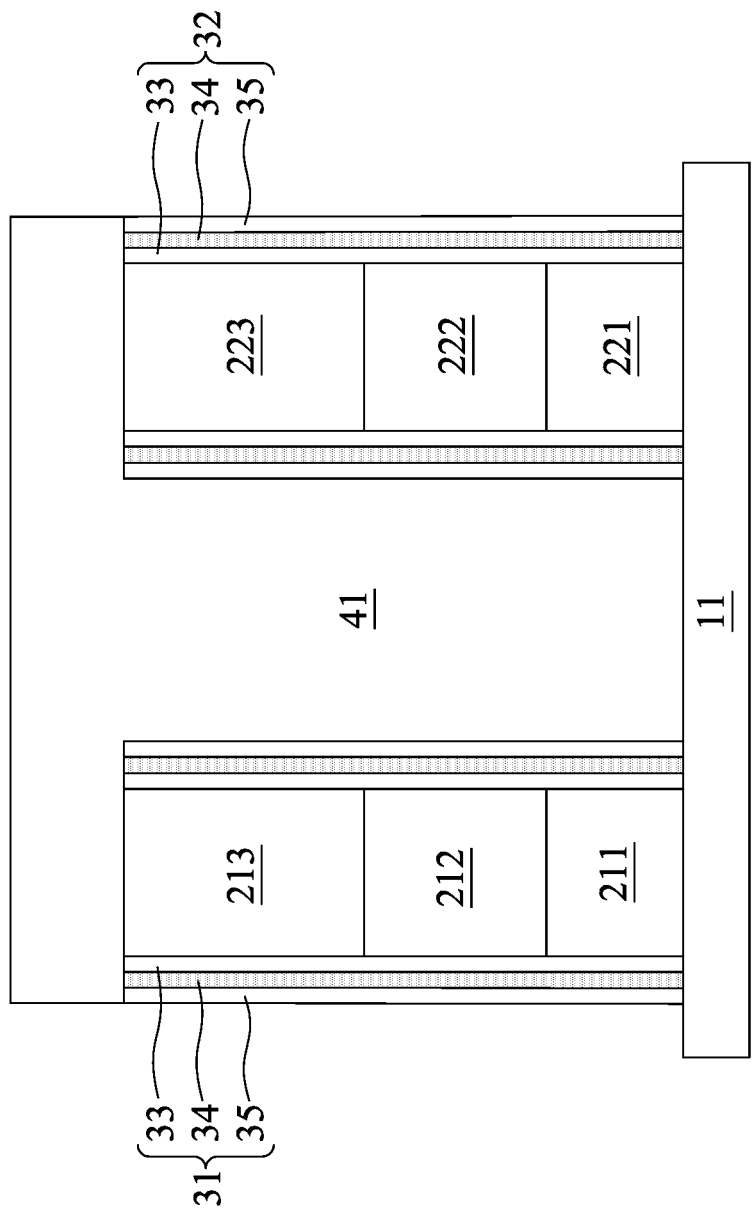

Referring to FIG. 17, FIG. 17 is a schematic cross-sectional diagram at a stage of the method S1 in accordance with some embodiments of the present disclosure. After the formation of the first spacer 31 and the second spacer 32, a first polysilicon layer 46 is disposed within the recess 61 and over the substrate 11 in the operation S108. In some embodiments, the first polysilicon layer 46 is formed by a blanket deposition. In some embodiments, the blanket deposition includes a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, the first polysilicon layer 46 covers the top surfaces 261 and 262 of the first bit line structures 21 and the second bit line structure 22. In some embodiments, a height of the first polysilicon layer 46 shown in FIG. 17 includes a height substantially greater than the first bit line structures 21 and the second bit line structure 22.

Figure 18:
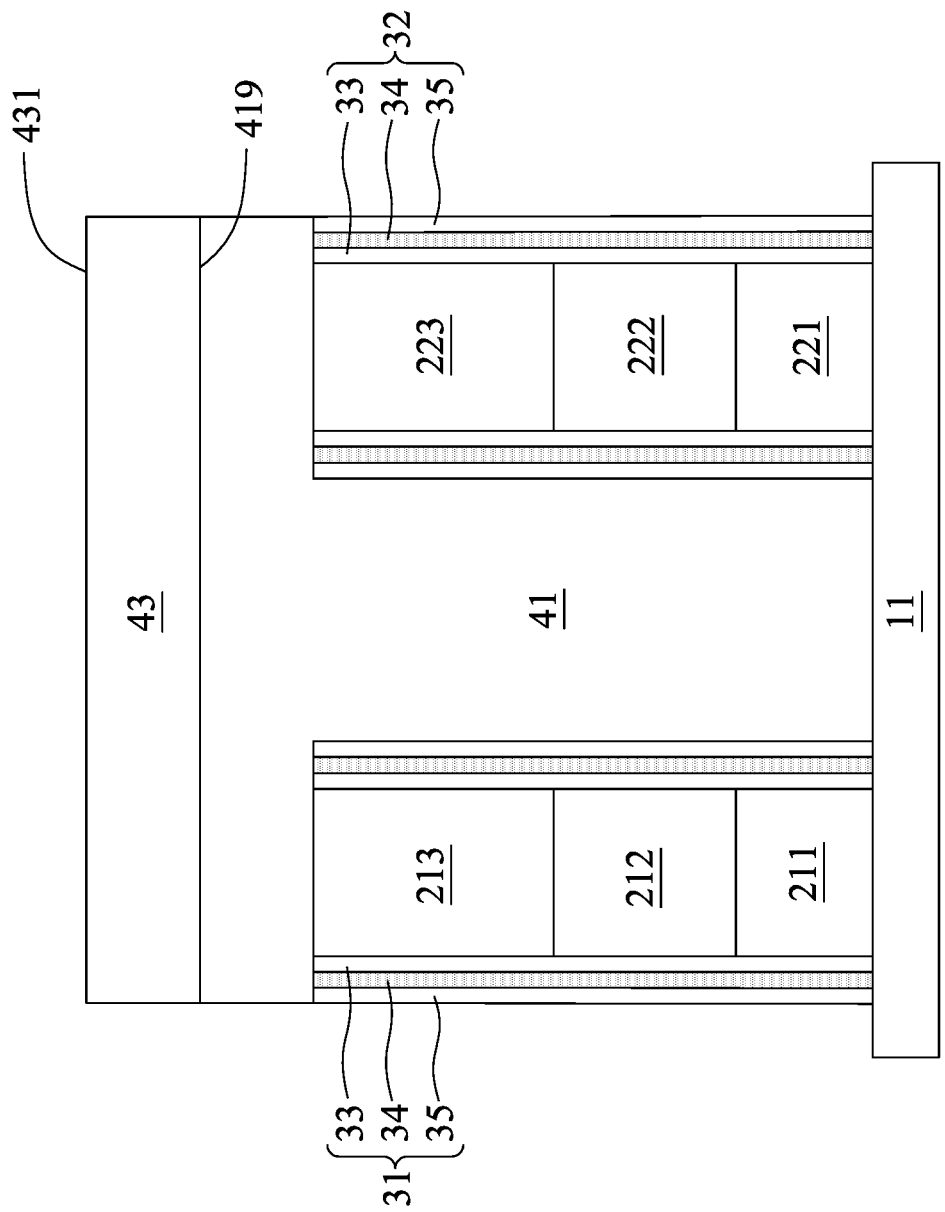

Referring to FIG. 18, FIG. 18 is a schematic cross-sectional diagram at a stage of the method S1 in accordance with some embodiments of the present disclosure. After the deposition of the first polysilicon layer 46, a sacrificial layer 43 is formed over the first polysilicon layer 46. In some embodiments, the sacrificial layer 43 at least covers a top surface 419 of the first polysilicon layer 46. It should be noted that FIG. 18 shows only a portion of the first polysilicon layer 46, and the top surface 419 of the first polysilicon layer 46 may not be a planar surface. The sacrificial layer 43 is configured to provide a planar surface for an etching or polishing operation to be performed in the subsequent processing in order to provide a better result of planarization. In some embodiments, the sacrificial layer 43 has a top surface 431, and the top surface 431 is a planar surface. The sacrificial layer 43 is for a purpose of compensation of uneven portions of the top surface 419 of the first polysilicon layer 46. In some embodiments, the sacrificial layer 43 includes a dielectric material, an anti-reflective coating material, an oxide-containing material, or other suitable materials. In some embodiments, the sacrificial layer 43 includes silicate glass, silicon oxide, silane oxide, or a combination thereof. In some embodiments, the sacrificial layer 42 includes borophosphosilicate glass (BPSG). In some embodiments, the sacrificial layer 43 includes a dielectric material different from that of the first dielectric layer 213 of the first bit line structure 21 or the third dielectric layer 223 of the second bit line structure 22. In some embodiments, the sacrificial layer 43 includes a dielectric material different from that of the second nitride layer 35 of the first spacer 31 or the second spacer 32. In some embodiments, the sacrificial layer 43 includes silicon.

Figure 19:
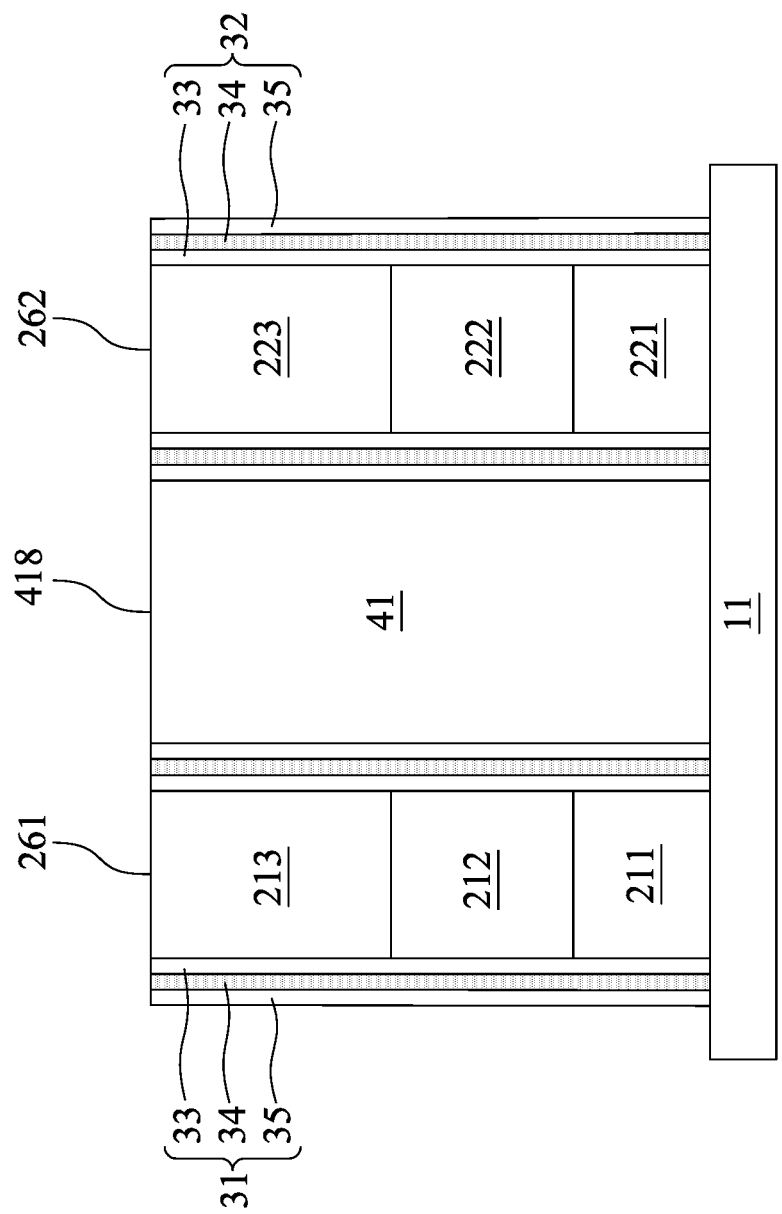

Referring to FIG. 19, FIG. 19 is a schematic cross-sectional diagram at a stage of the method S1 in accordance with some embodiments of the present disclosure. After the formation of the sacrificial layer 43, a planarization is performed on the sacrificial layer 43 and the first polysilicon layer 46. In some embodiments, the planarization includes ion beam etching, directional dry etching, reactive ion etching, solution wet etching, chemical mechanical polishing (CMP), or a combination thereof. In some embodiments, the planarization has a high selectivity to a material of the sacrificial layer 43. In some embodiments, the planarization has a high selectivity to a material of the first polysilicon layer 46. In some embodiments, the planarization has a low selectivity to a material of the first dielectric layer 213 and/or a material of the first spacer 31. In some embodiments, the planarization stops at an exposure of the top surfaces 261 of the first bit line structure 21 and the top surfaces 262 of the second bit line structure 22. In some embodiments, a top surface 418 of the polysilicon layer 41 is substantially coplanar with top surfaces 261 of the first bit line structure 21 and the top surfaces 262 of the second bit line structure 22.

Figure 20:
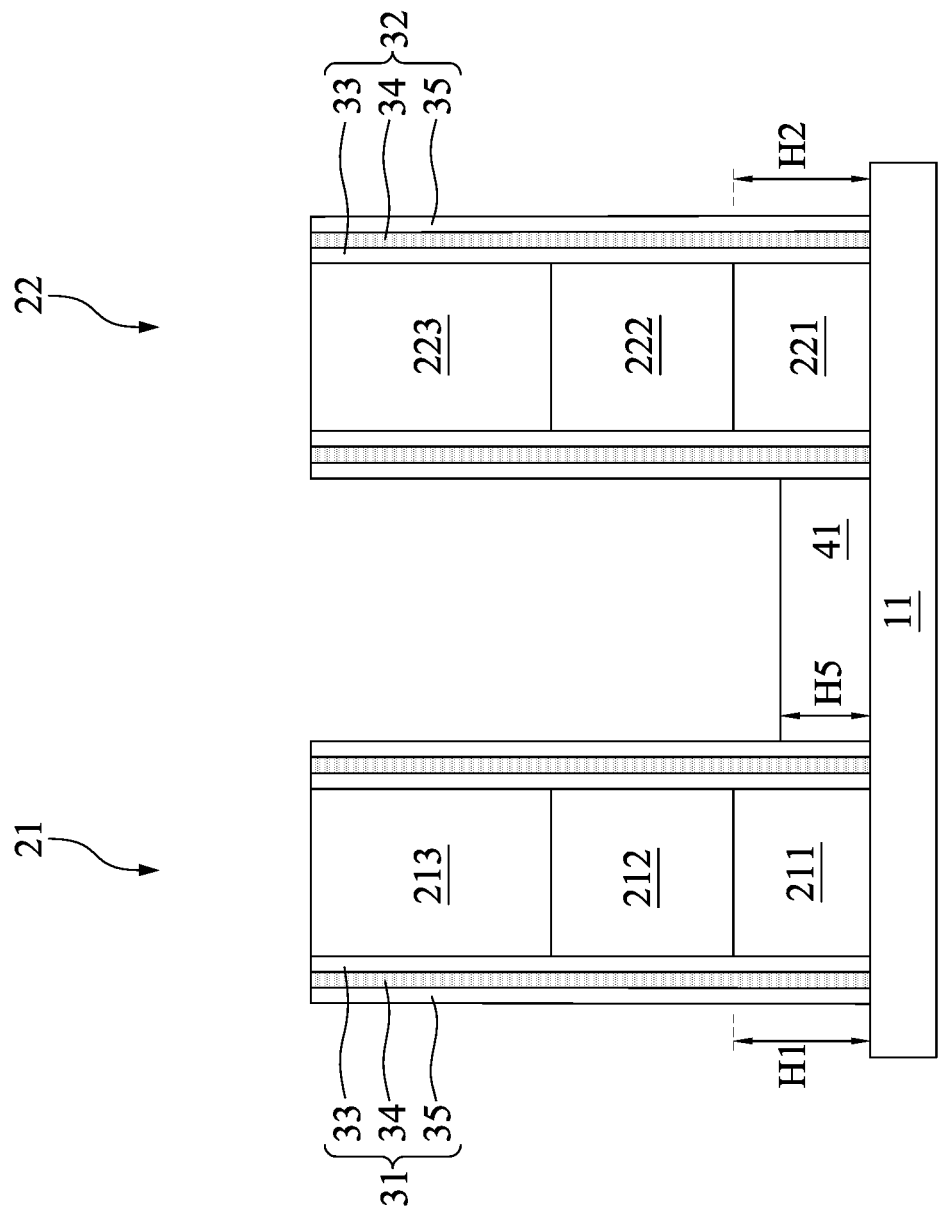

Referring to FIG. 20, FIG. 20 is a schematic cross-sectional diagram at a stage of the method S1 in accordance with some embodiments of the present disclosure. After the planarization is performed on the sacrificial layer 43 and the first polysilicon layer 46, portions of the first polysilicon layer is removed. In some embodiments, the removal of the portions of the first polysilicon layer 46 includes etching or any other suitable process. In some embodiments, a height H5 of the first polysilicon layer 46 is obtained after the removal of the portions of the first polysilicon layer. In some embodiments, the height H5 is less than the height H1 of the first conductive layer 211 of the first bit line structure 21, or is less than the height H2 of the second dielectric layer 221 of the second bit line structure 22. In some embodiments, the first bit line structure 21 or the second bit line structure 22 protrudes from and is exposed through the first polysilicon layer 46 after the removal of the portions the first polysilicon layer 46.

Figure 21:
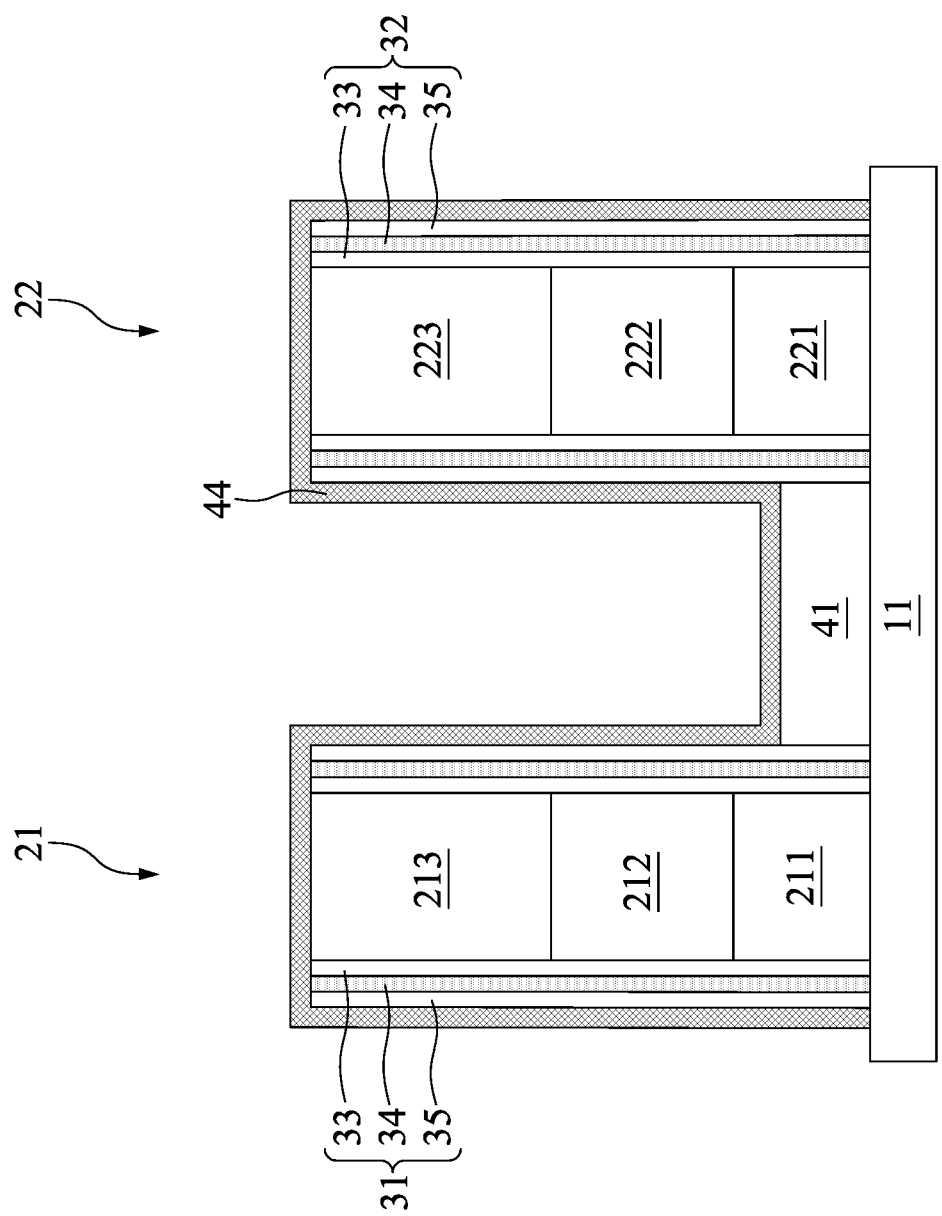
Figure 22:
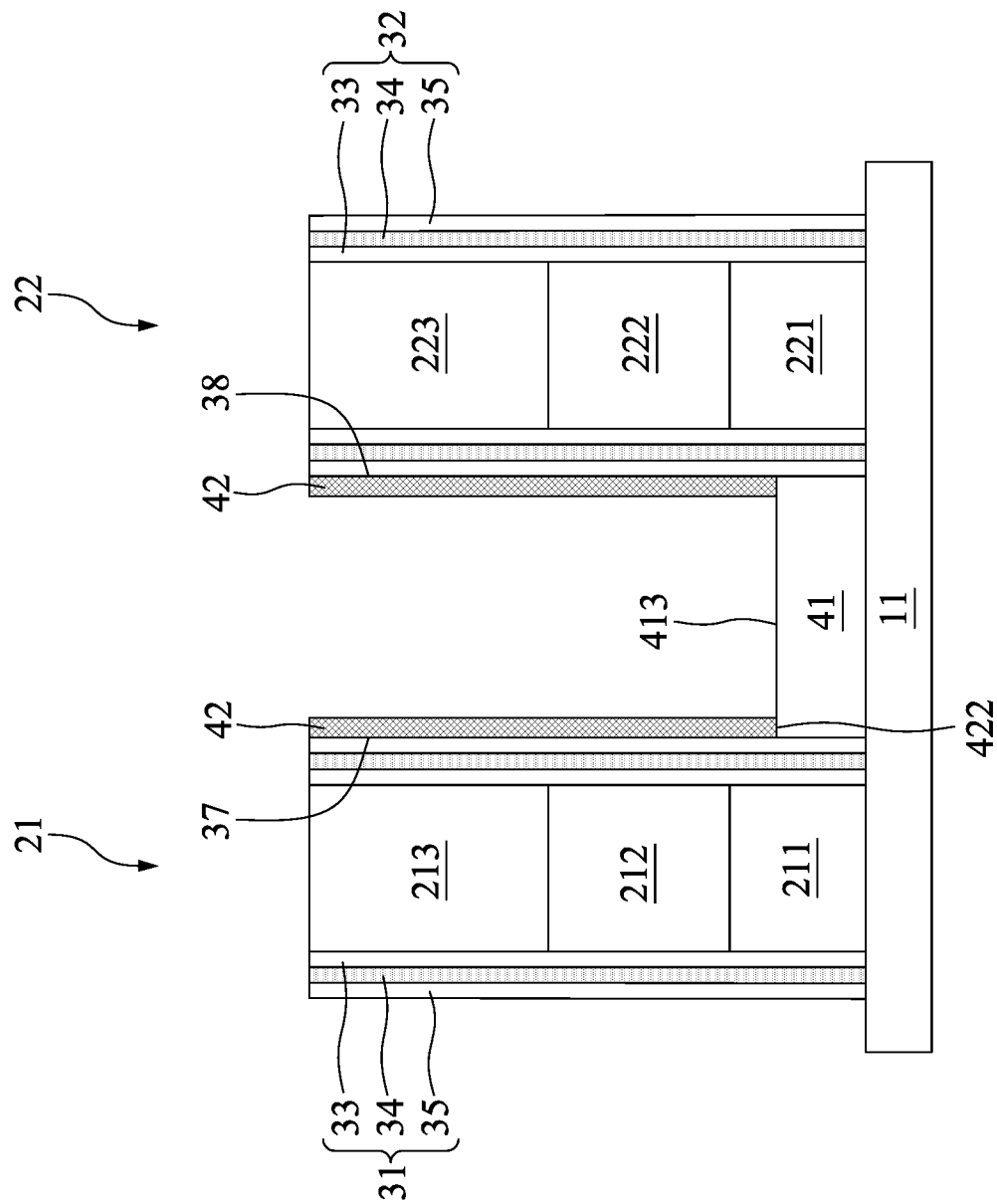

Referring to FIGS. 21 to 22, FIGS. 21 to 22 are schematic cross-sectional diagrams at a stage of the method S1 in accordance with some embodiments of the present disclosure. In some embodiments, the operation S109 is performed after the operation S108 and includes multiple steps.

Referring to FIG. 21, FIG. 21 is a schematic cross-sectional diagram at a stage of the method S1 in accordance with some embodiments of the present disclosure. After the deposition of the first polysilicon layer 46, a fourth dielectric layer 44 is formed over the first bit line structure 21, the second bit line structure 22, the first space 31, the second spacer 32 and the first polysilicon layer 46.

In some embodiments, the fourth dielectric layer 44 includes a dielectric material. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure. In some embodiments, the fourth dielectric layer 44 is formed by a conformal deposition.

Referring to FIG. 22, FIG. 22 is a schematic cross-sectional diagram at a stage of the method S1 in accordance with some embodiments of the present disclosure. After the deposition of the fourth dielectric layer 44, horizontal portions of the fourth dielectric layer 44 are removed to form a dielectric liner 42 along a sidewall 37 of the first spacer 31, a sidewall 38 of the second spacer 32 and over the first polysilicon layer. In some embodiments, the removal of the horizontal portions of the fourth dielectric layer 44 includes a wet etching operation, a dry etching operation, or a combination thereof performed to form the dielectric liner 42. In some embodiments, the removal of the horizontal portions of the fourth dielectric layer 44 includes a selective wet etching, a directional dry etching, an ion beam etching, a reactive ion etching, or a combination thereof. In some embodiments, a bottom surface 422 of the dielectric liner 42 is substantially coplanar with a top surface 413 of the first polysilicon layer 46.

Figure 23:
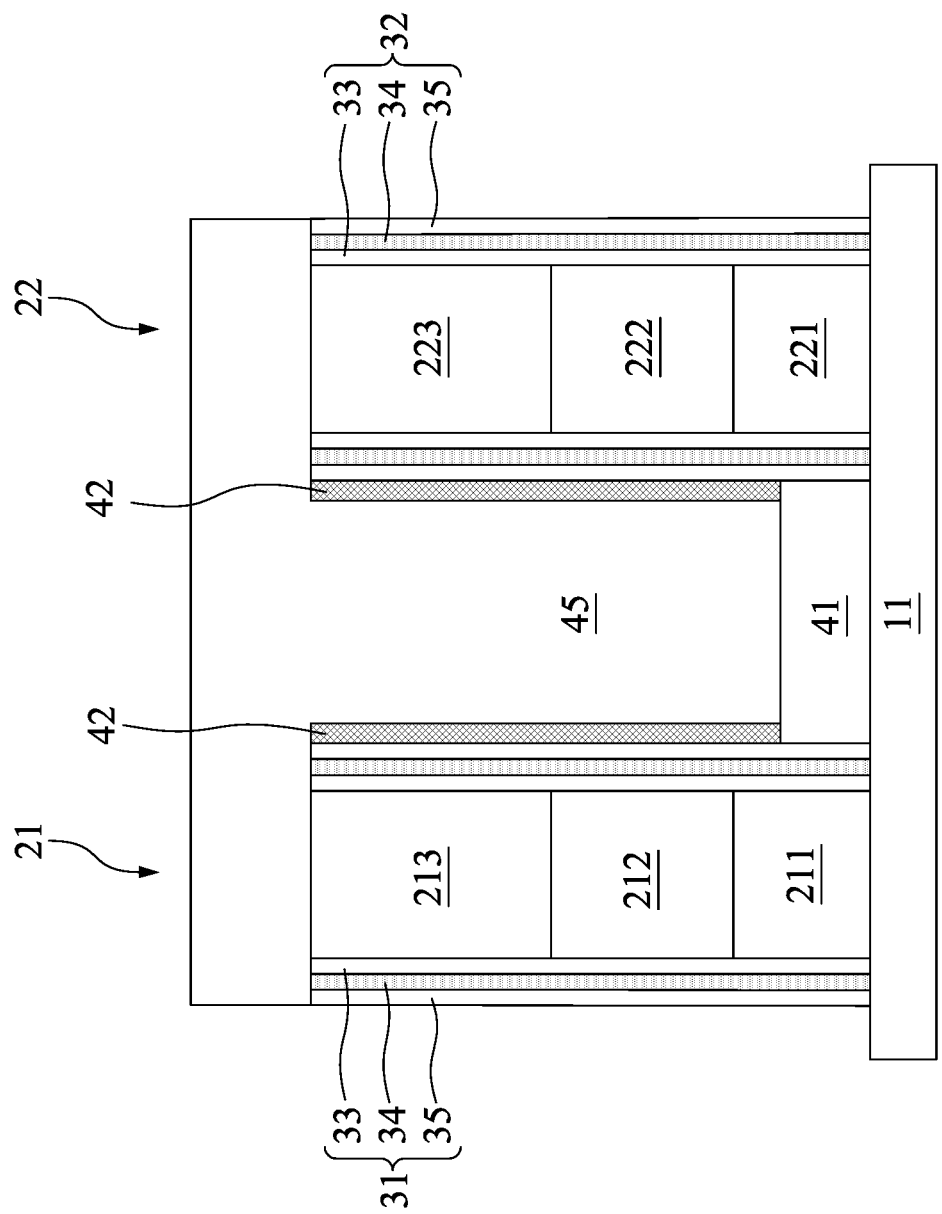
Figure 24:
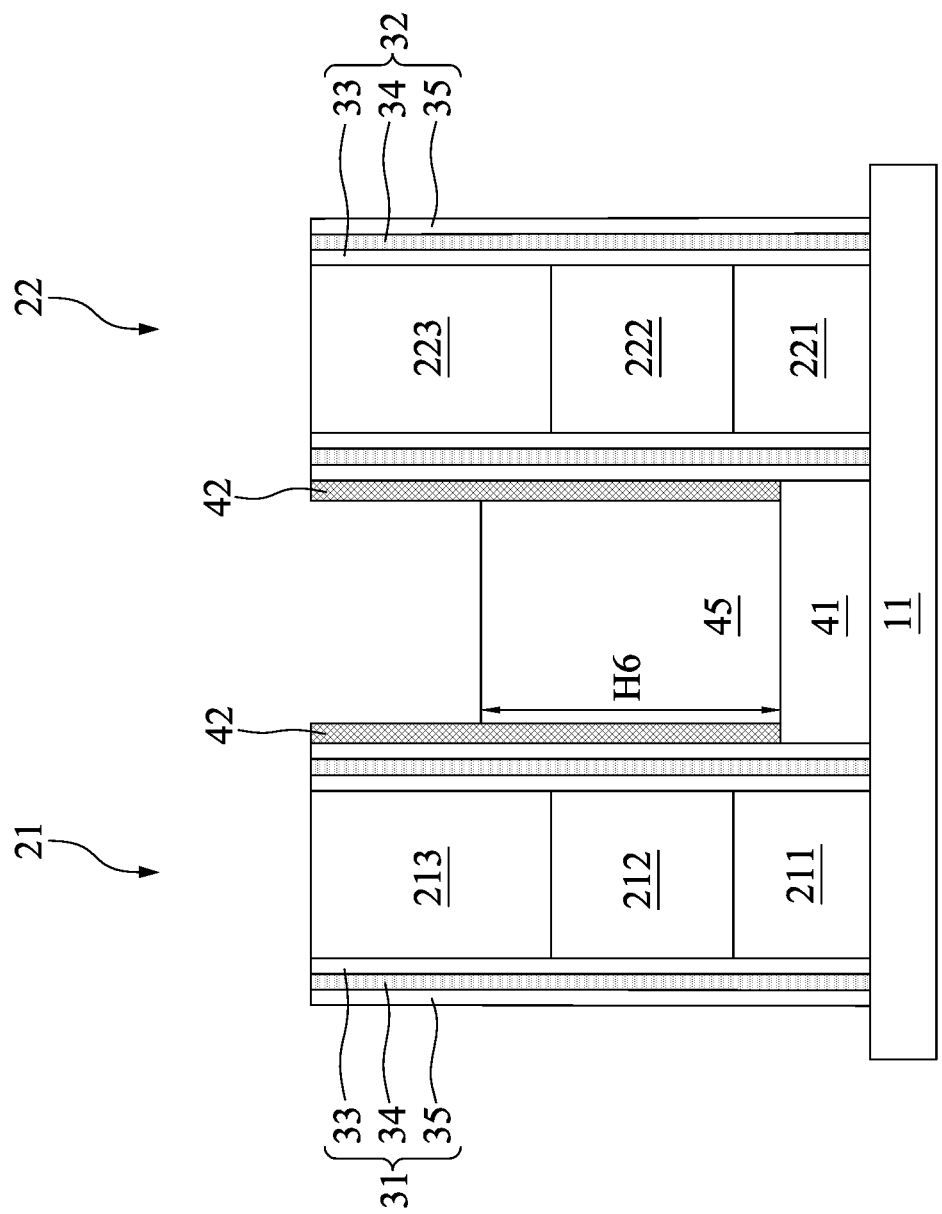

Referring to FIGS. 23 to 24, FIGS. 23 to 24 are schematic cross-sectional diagrams at a stage of the method S1 in accordance with some embodiments of the present disclosure. In some embodiments, the operation S110 is performed after the operation S109 and includes multiple steps.

Referring to FIG. 23, FIG. 23 is a schematic cross-sectional diagram at a stage of the method S1 in accordance with some embodiments of the present disclosure. After the formation of the dielectric liner 42, a second polysilicon layer 45 is disposed over first bit line structure 21, the first space 31, the dielectric liner 42, the first polysilicon layer 46, the second bit line structure 22 and the second spacer 32. In some embodiments, the first polysilicon layer 46 and the second polysilicon layer 45 include a same material.

Referring to FIG. 24, FIG. 24 is a schematic cross-sectional diagram at a stage of the method S1 in accordance with some embodiments of the present disclosure. After the deposition of the second polysilicon layer 45, portions of the second polysilicon layer 45 are removed to form the second polysilicon layer 45 in the operation S110. In some embodiments, a height H6 of the second polysilicon layer 45 is obtained after the removal of the portions of the second polysilicon layer 45. In some embodiments, the first bit line structure 21 and the second bit line structure 22 protrude from and are exposed through the second polysilicon layer 45 after the removal of the portions the second polysilicon layer 45.

Figure 25:
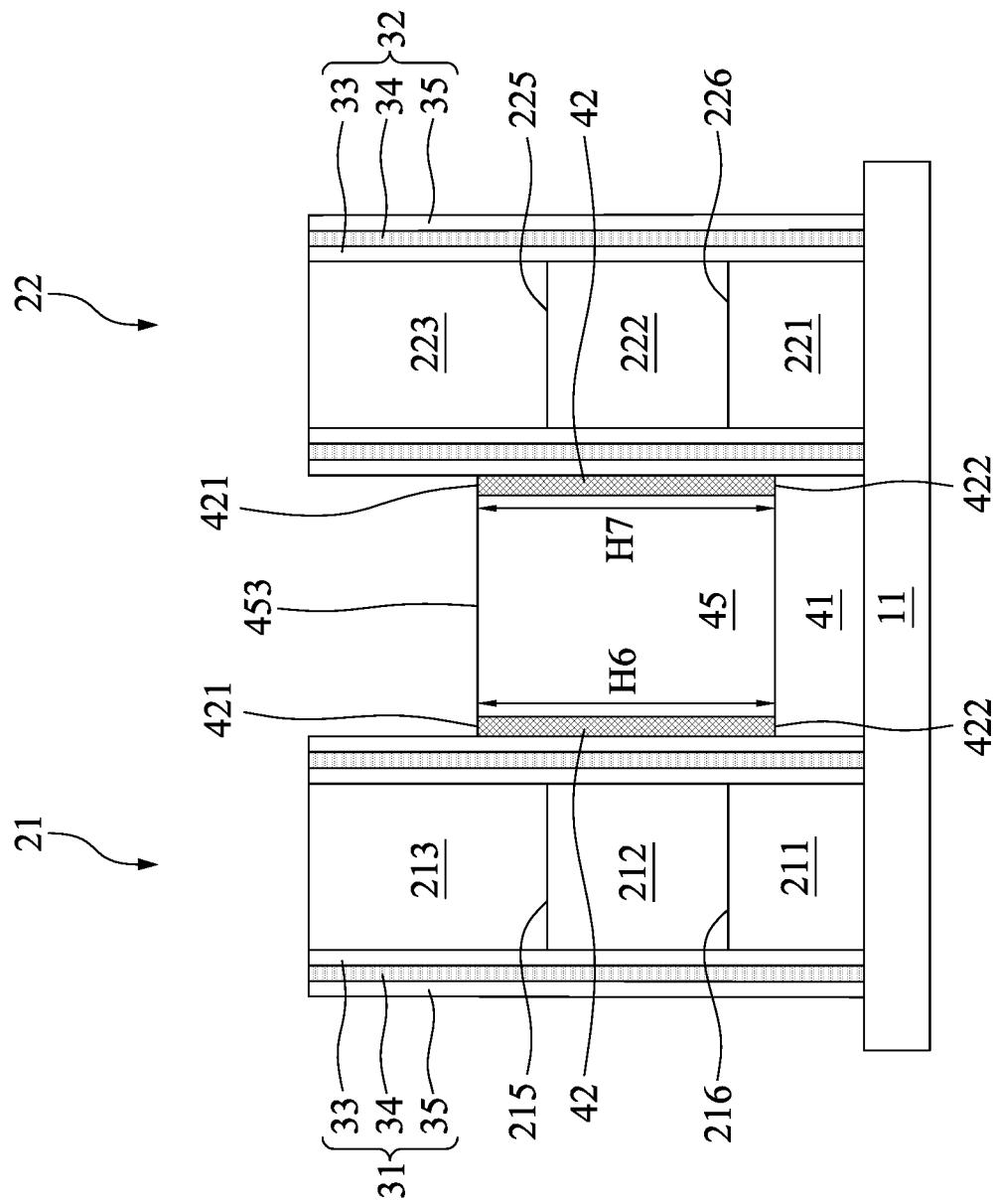

Referring to FIG. 25, FIG. 25 is a schematic cross-sectional diagram at a stage of the method S1 in accordance with some embodiments of the present disclosure. In some embodiments, the operation S111 is performed after the operation S110. After the formation of the second polysilicon layer 45, portions of the dielectric liner 42 are removed. In some embodiments, a height H7 of the dielectric liner 42 is obtained after the removal of the portions of the dielectric liner 42. In some embodiments, the height H7 of the dielectric liner 42 is substantially equal to the height H6 of the second polysilicon layer. In some embodiments, a top surface 453 of the second polysilicon layer 45 is substantially coplanar with the top surface 421 of the dielectric liner 42.

In some embodiments, a top surface 421 of the dielectric liner 42 is above a top surface 215 of the second conductive layer 212 of the first bit line structure 21, and a bottom surface 422 of the dielectric liner 42 is below a bottom surface 216 of the second conductive layer 212 of the first bit line structure 21. In other words, a height of the dielectric liner 42 is substantially greater than a height of the second conductive layer 212 of the first bit line structure 21.

In some embodiments, the top surface 421 of the dielectric liner 42 is above a top surface 225 of the third conductive layer 222, and the bottom surface 422 of the dielectric liner 42 is below a bottom surface 226 of the third conductive layer 222. In other words, a height of the dielectric liner 42 is substantially greater than a height of the third conductive layer 222 of the second bit line structure 22.

Figure 26:
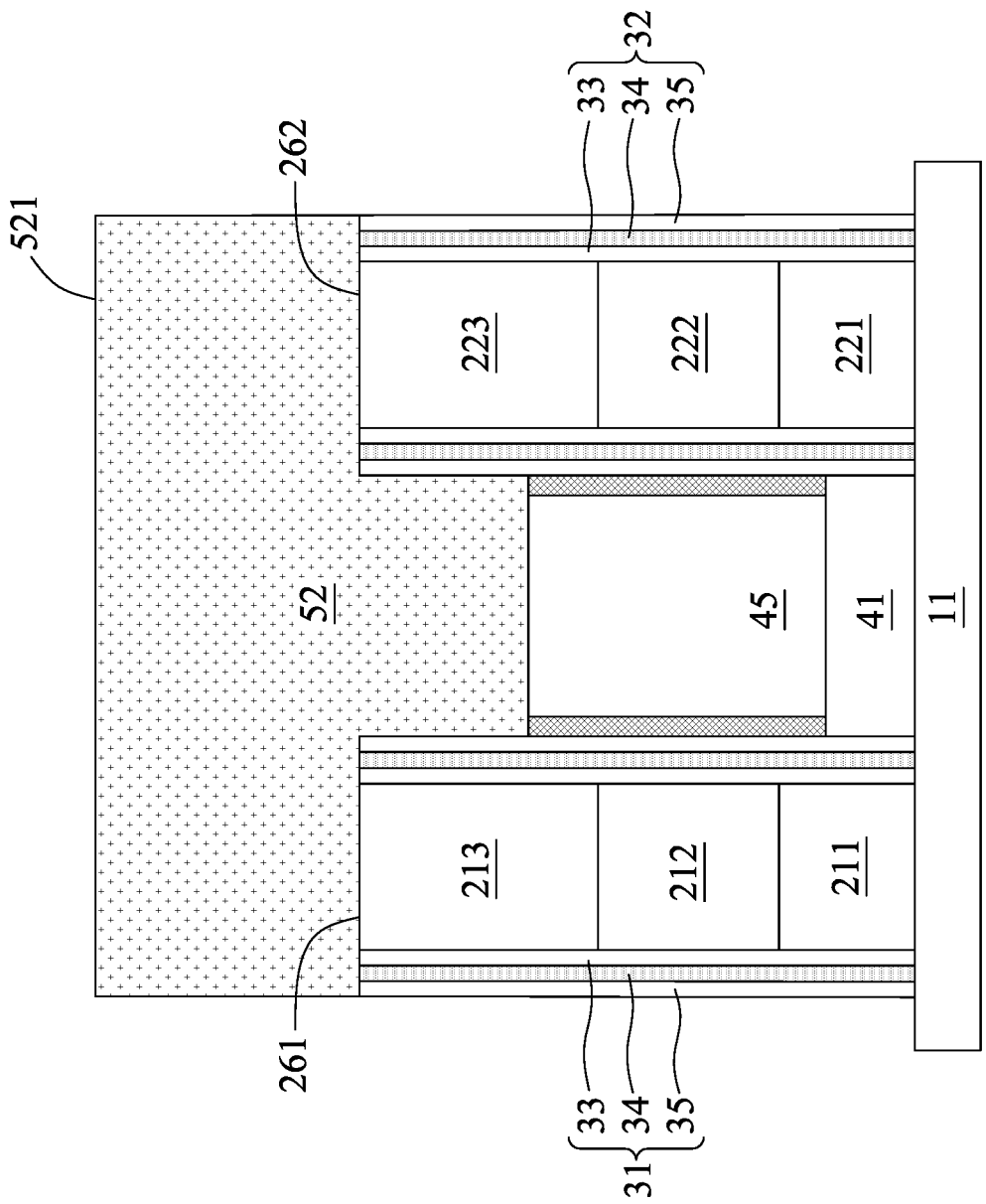

Referring to FIG. 26, FIG. 26 is a schematic cross-sectional diagram at a stage of the method S1 in accordance with some embodiments of the present disclosure. After the removal of the portions of the dielectric liner 42, the method S1 further includes forming a metallic layer 52 covering the first bit line structure 21, the second bit line structure 22, the first spacer 31, the second space 32, the dielectric liner 42 and the second polysilicon layer 45. In some embodiments, the metallic layer 52 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, the metallic layer 52 includes tungsten, copper, or a combination thereof. In some embodiments, the metallic layer 52 is formed by CVD, PVD, LPCVD, PECVD, a sputtering operation, electroplating, or a combination thereof. In some embodiments, the metallic layer 52 at least covers the top surface 261 of the first bit line structures 21 and the top surface 262 of the second bit line structure 21. It should be noted that FIG. 26 shows only a portion of the metallic layer 52, and a top surface 521 of the metallic layer 52 may not be a planar surface.

Figure 27:
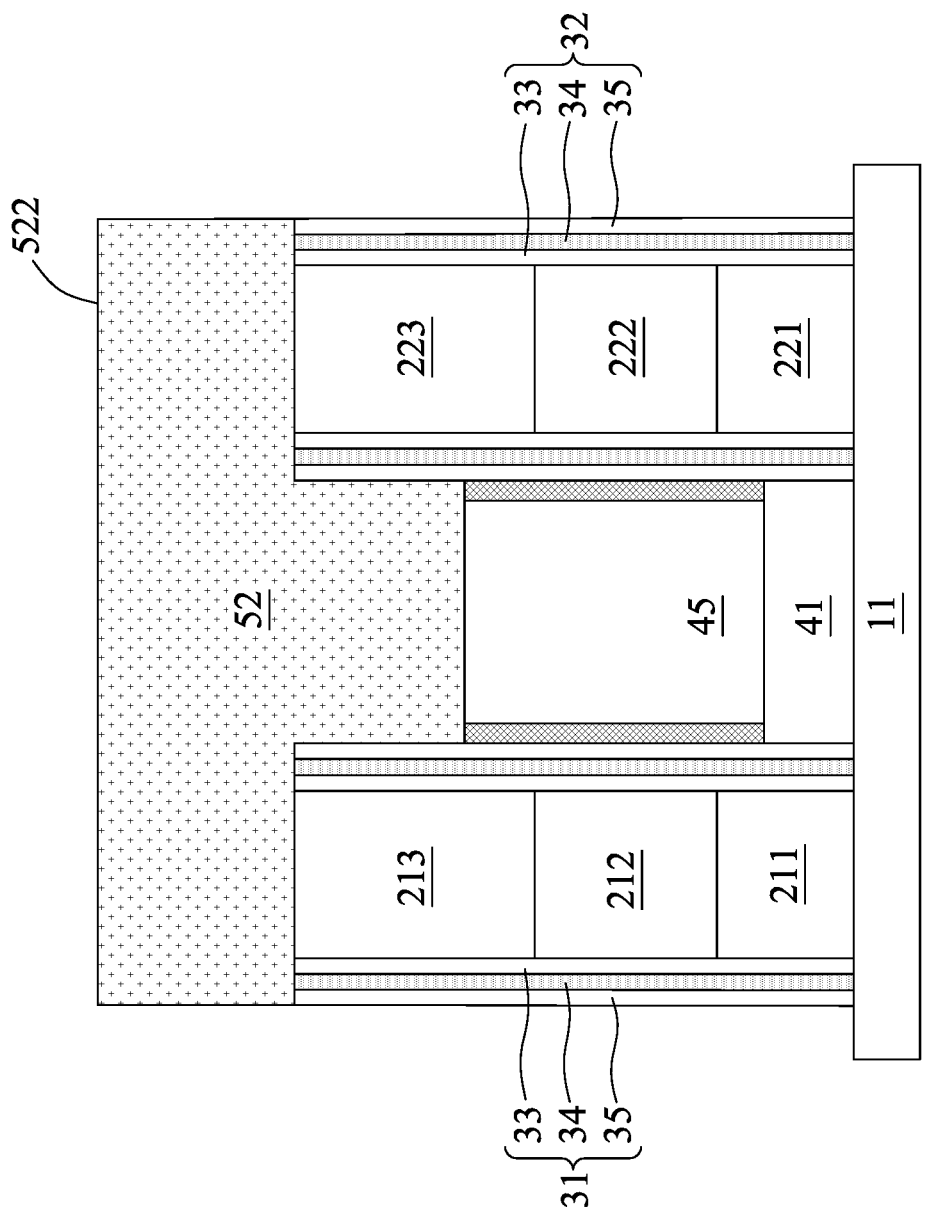

Referring to FIG. 27, FIG. 27 is a schematic cross-sectional diagram at a stage of the method S1 in accordance with some embodiments of the present disclosure. After the formation of the metallic layer 52, the method S1 may further include a planarization. In some embodiments, the planarization includes ion beam etching, directional dry etching, reactive ion etching, solution wet etching, CMP, or a combination thereof. In some embodiments, the planarization includes a polishing operation (e.g., a CMP operation). In some embodiments, a top surface 522 of the metallic layer 52 is formed after the planarization. In some embodiments, the top surface 522 is a planar surface disposed at an elevation lower than the top surface 521 shown in FIG. 26.

Figure 28:
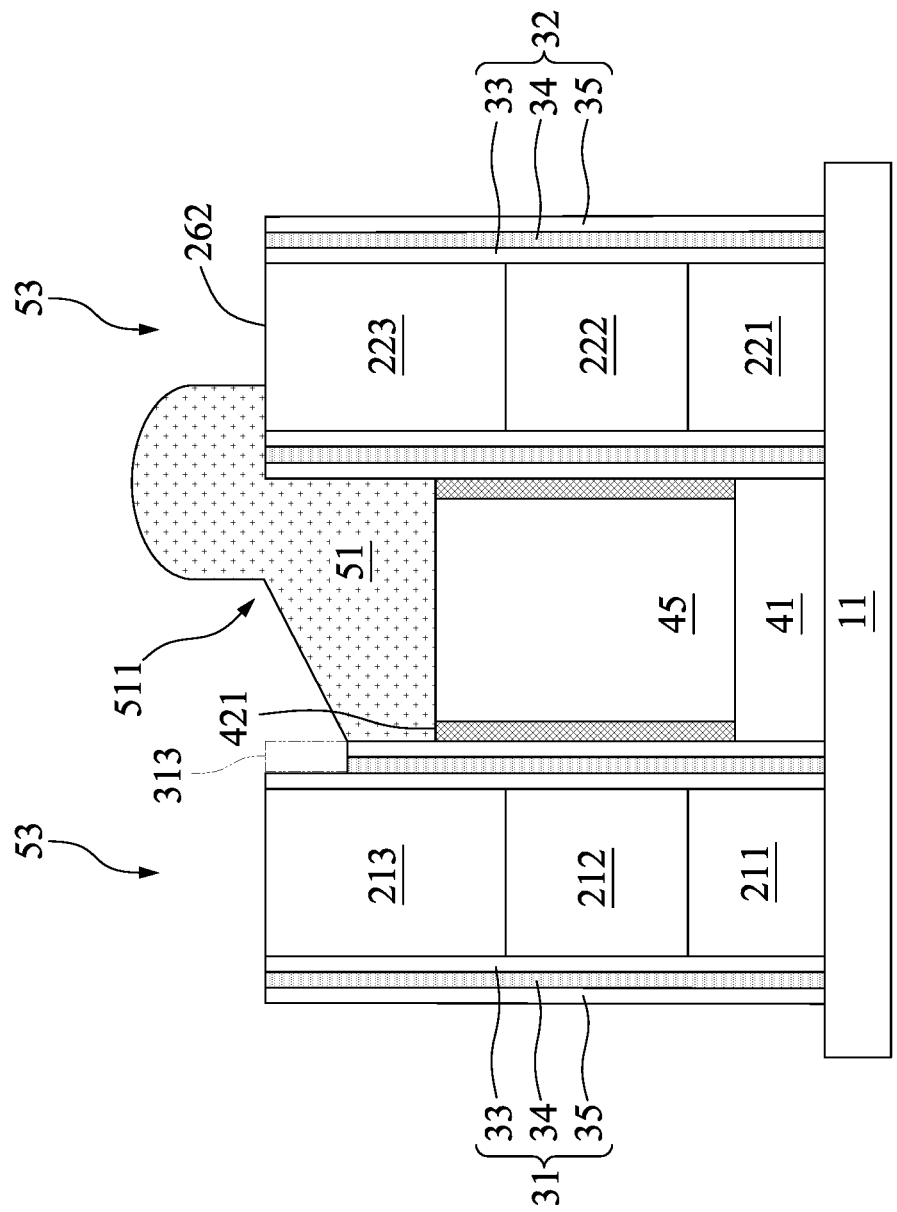

Referring to FIG. 28, FIG. 28 is a schematic cross-sectional diagram at a stage of the method S1 in accordance with some embodiments of the present disclosure. After the planarization, the method S1 may further include removing portions of the metallic layer 52 to form a landing pad 51. In some embodiments, a plurality of openings 53 are formed on the metallic layer 52 and thereby define a plurality of landing pads 51. In some embodiments, an upper portion 313 of the first spacer 31 surrounding the first bit line structure 21 is partially removed during the removal of the portions of the metallic layer 52. In some embodiments, the first spacer 31 portions of the second spacer 32 are exposed in the plurality of openings 53. In alternative embodiments, only portions of the metallic layer 52 are removed. In some embodiments, configurations of the first bit line structure 21, the second bit line structure 22, the first spacer 31 and the second spacer 32 remain the same before, during and after the removal of the portions of the metallic layer 52.

In some embodiments, the landing pad 51 is disposed over the second polysilicon layer 45 and the second bit line structure 22, and includes a neck portion 511 aligned with the top surface 262 of the second bit line structure 22. In some embodiments, the top surface 421 of the dielectric liner 42 is below the neck portion 511 of the landing pad 51.

Figure 29:
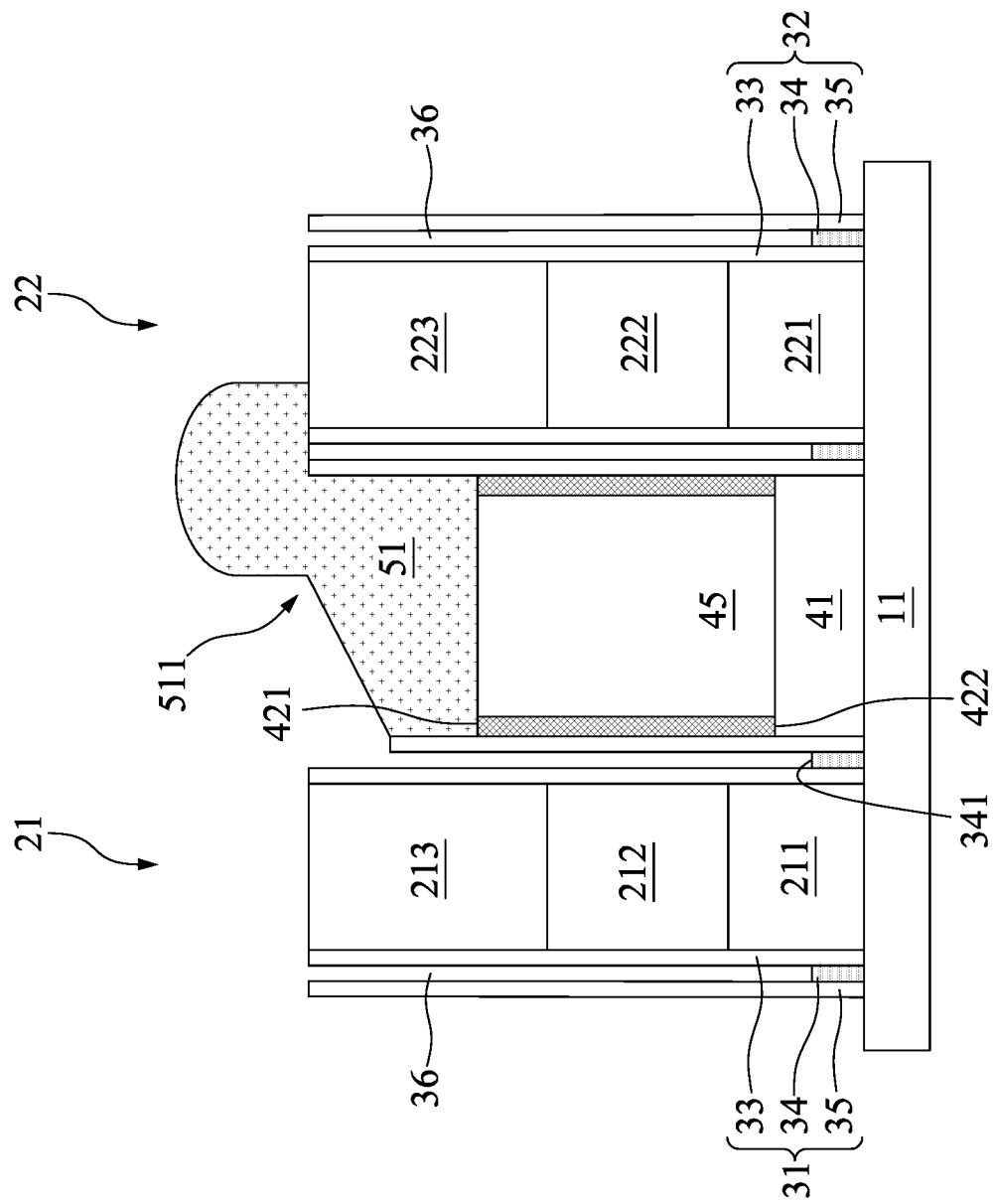

Referring to FIG. 29, FIG. 29 is a schematic cross-sectional diagram at a stage of the method S1 in accordance with some embodiments of the present disclosure. After the formation of the landing pad 51, the method S1 may further include removing portions of the oxide layer 34 to form an air gap 36 surrounded by the first nitride layer 33, the second nitride layer 35 and the oxide layer 34. The air gap 36 is thereby formed in place of the removed oxide layer 34. In some embodiments, the removal of the portions of the oxide layer 34 includes vapor etching, a solution wet etching, or a combination thereof. In some embodiments, vapor-phase hydrogen fluoride (HF) is used to remove the portions of the oxide layer 34. In some embodiments, a top surface 341 of the oxide layer 34 is below the bottom surface 422 of the dielectric liner 42. A semiconductor structure similar to that shown in FIG. 1 is thereby formed.

Therefore, the present disclosure provides a novel structure of a bit line structure and a method for manufacturing the same. The bit line structure of the present disclosure has a dielectric liner disposed along a sidewall of the polysilicon layer. The dielectric liner may prevent the charges (e.g., stored in a capacitor configured on the landing pad) from being leaked to the polysilicon layer. In addition, the neck portion may of the landing pad may not be narrowed due to the deposition of the dielectric liner since the top surface of the dielectric liner is below the neck portion of the landing pad.

One aspect of the present disclosure provides a semiconductor structure. The semiconductor structure includes a substrate; a first bit line structure, disposed over the substrate, comprising a first conductive layer, a second conductive layer disposed over the first conductive layer, and a first dielectric layer disposed over the second conductive layer; a second bit line structure, disposed over the substrate, comprising a second dielectric layer, a third conductive layer disposed over the second dielectric layer, and a third dielectric layer disposed over the third conductive layer; a polysilicon layer, disposed over the substrate and surrounded by the first bit line structure and the second bit line structure; a dielectric liner, surrounding at least a portion of the polysilicon layer; and a landing pad, disposed over the polysilicon layer, the dielectric liner and the second bit line structure.

In some embodiments, the first dielectric layer, the second dielectric layer and the third dielectric layer comprise a same material.

In some embodiments, the second conductive layer and the third conductive layer comprise a same material.

In some embodiments, a height of the first conductive layer is substantially equal to a height of the second dielectric layer.

In some embodiments, a height of the second conductive layer is substantially equal to a height of the third conductive layer.

In some embodiments, the semiconductor structure further comprises a first spacer, surrounding the first bit line structure; and a second spacer, surrounding the second bit line structure.

In some embodiments, the first spacer and the second spacer respectively are a multi-layer structure, and comprise nitride and oxide.

In some embodiments, a top surface of the first spacer and a top surface of the second spacer are above a top surface of the polysilicon layer.

In some embodiments, a top surface of the dielectric liner is above a top surface of the second conductive layer, and a bottom surface of the dielectric liner is below a bottom surface of the second conductive layer.

In some embodiments, a top surface of the dielectric liner is above a top surface of the third conductive layer, and a bottom surface of the dielectric liner is below a bottom surface of the third conductive layer.

In some embodiments, the landing pad comprises a neck portion aligned with a top surface of the second bit line structure.

In some embodiments, a top surface of the dielectric liner is below the neck portion of the landing pad.

Another aspect of the present disclosure provides a semiconductor structure. The semiconductor structure includes: a substrate; a first bit line structure, disposed over the substrate; a second bit line structure, disposed over the substrate; a polysilicon layer, surrounded by the first bit line structure and the second bit line structure; and a dielectric liner, disposed along a sidewall of the polysilicon layer.

In some embodiments, the semiconductor structure further comprises a metallic layer, disposed over the polysilicon layer and covering the first bit line structure and the second bit line structure.

In some embodiments, the metallic layer comprises a plurality of openings exposing a top surface of the first bit line structure and portions of a top surface of the second bit line structure.

In some embodiments, the semiconductor structure further comprises a spacer, disposed along a sidewall of the first bit line structure and a sidewall of the second bit line structure, wherein the spacer surrounds the polysilicon layer and the dielectric liner.

In some embodiments, the spacer protrudes from the polysilicon layer.

In some embodiments, the first bit line structure comprises a first conductive layer under a top surface of the first bit line structure, and the second bit line structure comprises a second conductive layer under a top surface of the second bit line structure.

In some embodiments, a top surface of the dielectric liner is above a top surface of the first conductive layer, and a bottom surface of the dielectric liner is below a bottom surface of the first conductive layer.

In some embodiments, a top surface of the dielectric liner is above a top surface of the second conductive layer, and a bottom surface of the dielectric liner is below a bottom surface of the second conductive layer.

Another aspect of the present disclosure provides a method of manufacturing a semiconductor structure. The method includes: providing a substrate; disposing a first conductive layer over the substrate; removing portions of the first conductive layer; disposing a second dielectric layer adjacent to the first conductive layer; disposing a second conductive layer over the first conductive layer and the second dielectric layer, and a first dielectric layer over the second conductive layer; removing portions of the first dielectric layer, the second conductive layer and the second dielectric layer, to form a first bit line structure comprising the first conductive layer, the second conductive layer and the first dielectric layer, to form a second bit line structure comprising the second dielectric layer, a third conductive layer and a third dielectric layer, and to form a recess between the first bit line structure and the second bit line structure; forming a first spacer surrounding the first bit line structure and a second spacer surrounding the second bit line structure; forming a first polysilicon layer within the recess and over the substrate; forming a dielectric liner along a sidewall of the first spacer, a sidewall of the second spacer and over the polysilicon layer; forming a second polysilicon layer over the first polysilicon layer; and removing portions of the dielectric liner.

In some embodiments, a top surface of the first conductive layer is substantially coplanar with a top surface of the second dielectric layer.

In some embodiments, a height of the first polysilicon layer is less than a height of the first conductive layer, or the height of the first polysilicon layer is less than a height of the second dielectric layer.

In some embodiments, a bottom surface of the dielectric liner is substantially coplanar with a top surface of the first polysilicon layer, and a top surface of the dielectric liner is above a top surface of the second conductive layer.

In some embodiments, a top surface of the second polysilicon layer is substantially coplanar with the top surface of the dielectric liner.

In some embodiments, the method further comprises forming a metallic layer covering the first bit line structure, the second bit line structure, the spacer, the dielectric liner and the second polysilicon layer.

In some embodiments, the method further comprises removing portions of the metallic layer to form a landing pad.

In some embodiments, an upper portion of the first spacer surrounding the first bit line structure is partially removed during the removal of the portions of the metal layer.

In some embodiments, the landing pad is disposed over the second polysilicon layer and the second bit line structure, and comprises a neck portion aligned with a top surface of the second bit line structure.

In some embodiments, a top surface of the dielectric liner is below the neck portion of the landing pad.

In some embodiments, each of the first spacer and the second spacer comprises two nitride layers and an oxide layer sandwiched between the two nitride layers.

In some embodiments, the method further comprises removing portions of the oxide layer to form an air-gap surrounded by the two nitride layers and the oxide layer.

In some embodiments, a top surface of the oxide layer is below a bottom surface of the dielectric liner.

In conclusion, the application discloses a manufacturing method of a semiconductor structure and a semiconductor structure thereof. A presence of a dielectric liner of the semiconductor structure prevents a storage leakage from the bit line structure to the polysilicon layer, and the correctness of the data stored in the bit line structure can be protected.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
   a substrate;
   a first bit line structure, disposed over the substrate, comprising a first conductive layer formed on and in contact with the substrate, a second conductive layer disposed over and in contact with the first conductive layer, and a first dielectric layer disposed over and in contact with the second conductive layer;
   a second bit line structure, disposed over the substrate, comprising a second dielectric layer formed on and in contact with the substrate, a third conductive layer disposed over and in contact with the second dielectric layer, and a third dielectric layer disposed over and in contact with the third conductive layer;
   a polysilicon layer, disposed over and in contact with the substrate and surrounded by the first bit line structure and the second bit line structure;
   a dielectric liner, surrounding at least a portion of the polysilicon layer; and
   a landing pad, disposed over the polysilicon layer, the dielectric liner and the second bit line structure;
   wherein a width of the first bit structure is equal to a width of the second bit structure, such that the first conductive layer, the second conductive layer, the first dielectric layer, the second dielectric layer, the third conductive layer, and the third dielectric layer are equal in width.

2. The semiconductor structure of claim 1, wherein the first dielectric layer, the second dielectric layer and the third dielectric layer comprise a same material, wherein the polysilicon layer has a narrowed upper portion and an enlarged bottom portion, wherein the dielectric liner surrounds the upper portion of the polysilicon layer.

3. The semiconductor structure of claim 1, wherein the second conductive layer and the third conductive layer comprise a same material.

4. The semiconductor structure of claim 1, wherein a height of the first conductive layer is substantially equal to a height of the second dielectric layer.

5. The semiconductor structure of claim 1, wherein a height of the second conductive layer is substantially equal to a height of the third conductive layer.

6. The semiconductor structure of claim 1, further comprising:
a first spacer, surrounding the first bit line structure; and
a second spacer, surrounding the second bit line structure.

7. The semiconductor structure of claim 6, wherein the first spacer and the second spacer respectively are a multi-layer structure, and comprise nitride and oxide.

8. The semiconductor structure of claim 6, wherein a top surface of the first spacer and a top surface of the second spacer are above a top surface of the polysilicon layer.

9. The semiconductor structure of claim 1, wherein a top surface of the dielectric liner is above a top surface of the second conductive layer, and a bottom surface of the dielectric liner is below a bottom surface of the second conductive layer.

10. The semiconductor structure of claim 1, wherein a top surface of the dielectric liner is above a top surface of the third conductive layer, and a bottom surface of the dielectric liner is below a bottom surface of the third conductive layer.

11. The semiconductor structure of claim 1, wherein the landing pad comprises a neck portion aligned with a top surface of the second bit line structure, wherein the landing pad is in contact with a top surface of the polysilicon layer.

12. The semiconductor structure of claim 11, wherein a top surface of the dielectric liner is below the neck portion of the landing pad.

13. A semiconductor structure, comprising:
a substrate;
a first bit line structure, disposed over the substrate;
a second bit line structure, disposed over the substrate;
a polysilicon layer, surrounded by the first bit line structure and the second bit line structure; and
a dielectric liner, disposed along a sidewall of the polysilicon layer;
wherein a width of the first bit structure is equal to a width of the second bit structure.

14. The semiconductor structure of claim 13, further comprising:
a metallic layer, disposed over the polysilicon layer and covering the first bit line structure and the second bit line structure, wherein the metallic layer is in contact with a top surface of the polysilicon layer, a top surface of the first bit line structure, and a top surface of the second bit line structure.

15. The semiconductor structure of claim 14, wherein the metallic layer comprises a plurality of openings exposing the top surface of the first bit line structure and portions of the top surface of the second bit line structure.

16. The semiconductor structure of claim 13, further comprising:
a spacer, disposed along a sidewall of the first bit line structure and a sidewall of the second bit line structure, wherein the spacer surrounds the polysilicon layer and the dielectric liner.

17. The semiconductor structure of claim 16, wherein the spacer protrudes from a top surface of the polysilicon layer.

18. The semiconductor structure of claim 13, wherein the first bit line structure comprises a first conductive layer under a top surface of the first bit line structure, and the second bit line structure comprises a second conductive layer under a top surface of the second bit line structure.

19. The semiconductor structure of claim 18, wherein a top surface of the dielectric liner is above a top surface of the first conductive layer, and a bottom surface of the dielectric liner is below a bottom surface of the first conductive layer.

20. The semiconductor structure of claim 18, wherein a top surface of the dielectric liner is above a top surface of the second conductive layer, and a bottom surface of the dielectric liner is below a bottom surface of the second conductive layer.

* * * * *